US005703382A

United States Patent [19]
Hack et al.

[11] Patent Number: 5,703,382
[45] Date of Patent: Dec. 30, 1997

[54] ARRAY HAVING MULTIPLE CHANNEL STRUCTURES WITH CONTINUOUSLY DOPED INTERCHANNEL REGIONS

[75] Inventors: Michael G. Hack, Mountain View; I-Wei Wu, Los Altos, both of Calif.

[73] Assignee: Xerox Corporation, Stamford, Conn.

[21] Appl. No.: 559,862

[22] Filed: Nov. 20, 1995

[51] Int. Cl.$^6$ .................... A01L 29/04; G02F 1/1343
[52] U.S. Cl. ................ 257/72; 359/54; 359/59
[58] Field of Search .................. 359/54, 59, 87; 257/72, 412

[56] References Cited

U.S. PATENT DOCUMENTS

| | | | |
|---|---|---|---|
| 4,623,908 | 11/1986 | Oshima et al. | 357/23.7 |
| 4,907,041 | 3/1990 | Huang | 357/4 |
| 5,159,477 | 10/1992 | Shimada et al. | 257/72 |
| 5,250,835 | 10/1993 | Izawa | 257/408 |
| 5,401,982 | 3/1995 | King et al. | 257/59 |
| 5,412,493 | 5/1995 | Kunii et al. | 359/59 |
| 5,430,320 | 7/1995 | Lee | 257/412 |
| 5,488,001 | 1/1996 | Brotherton | 437/21 |
| 5,557,534 | 9/1996 | Wu | 364/491 |

OTHER PUBLICATIONS

Wu, I-W., Lewis, A., and Chiang, A., "Effects of Solid Phase Crystallization and LDD Doping on Leakage Current Distributions in Poly-Si TFTs with Multiple Gate Structures," *Japan Display '92*, SID, 1992, pp. 455–458.

Hack, M., Wu, I-W., Lewis, A.G., and King, T.J., "Numerical Simulations of On and Off State Characteristics of Poly–Silicon Thin Film Transistors," *Proceedings, 51st Annual Device Research Conference*, Santa Barbara, Calif., Jun. 21–23, 1993.

Wu, I-W., "Polycrystalline Silicon Thin Film Transistors for Liquid Crystal Displays," *Solid State Phenomena*, Scitec Publications, Switzerland, 1994, pp. 553–564.

Wu, I-W., "Cell Design Considerations for High–Aperture-Ratio Direct–View and Projection Polysilicon TFT–LCDs," *95 SID Digest*, May 1995, pp. 19–22.

Wu, I-W., Stuber, S., Tsai, C.C., Yao, W., Lewis, A., Fulks, R., Chiang, A., and Thompson, M., "Processing and Device Performance of Low–Temperature CMOS Poly–TFTs on 18.4–in.–Diagonal Substrates for AMLCD Application," *SID 92 Digest*, 1992, pp. 615–618.

Kaneko, E., "Novel Key Technologies Used to Fabricate Very–Large–Area TFT–LCD Panels," *SID 95 Digest*, pp. 150–153.

Wu, I-W., "Low Temperature Poly–Si Technology for AM–LCDs," *AM–LCD 95: 1995 International Workshop on Active–Matrix Liquid–Crystal Displays*, Osaka, Japan, Aug. 24–25, 1995, pp. 7–10.

Lewis, A., and Wu, I-W., "Polysilicon TFTs for Active Matrix Liquid Crystal Displays," *IEICE Transactions*, vol. J76–C–II, No. 5, May, 1993, p. 211–226.

(List continued on next page.)

*Primary Examiner*—Wael Fahmy
*Assistant Examiner*—Fetsum Abraham

[57] ABSTRACT

Cell circuitry in an array on a substrate includes a TFT or other structure with a series of two or more channels and with an intrachannel region between each pair of adjacent channels in the series. Each intrachannel region has a continuously distribution of dopant particles and the distribution of dopant particles in the intrachannel regions together controls reverse gate bias leakage current without significantly reducing ON current. The average dopant density in intrachannel regions can be sufficiently low to ensure that reverse gate bias leakage current is approximately constant across a range of reverse gate bias voltages. For applications such as light valve arrays, sensor arrays, and memory arrays in which each cell includes a capacitive element for storing a level of charge in one of two or more voltage bands, the average dopant density of intrachannel regions can ensure that reverse gate bias leakage current is sufficiently low that a level of charge stored by the capacitive element remains within its voltage band during a storage period.

27 Claims, 10 Drawing Sheets

OTHER PUBLICATIONS

Strum, J.C., Wu, I.-W., and Hack, M., "Leakage Current Modeling of Series–Connected Thin Film Transistors," *IEEE Transactions and Electron Devices*, vol. 42, No. 8, Aug. 1995, pp. 1561–1563.

Wu, I-Wei, "High–definition displays and technology trends in TFT–LCDs," *Journal of the SID*, Feb. 1, 1994, pp. 1–14.

U.S. Patent Application No. 08/277,719 entitled "Reduced Leakage Current Multiple Gate Thin Film Transistors", filed on Jul. 20, 1994.

U.S. Patent Application No. 08/560,724 entitled "Forming Array Having Multiple Channel Structures with Continuously Doped Interchannel Regions", filed on Nov. 20, 1995.

U.S. Patent Application No. 08/572,357 entitled "Array with Metal Scan Lines Controlling Semiconductor Gate Lines", filed on Dec. 15, 1995.

U.S. Patent Application No. 08/367,984 entitled "Circuitry with Gate Line Crossing Semiconductor Line at Two or More Channels", filed on Jan. 3, 195.

1

ARRAY HAVING MULTIPLE CHANNEL STRUCTURES WITH CONTINUOUSLY DOPED INTERCHANNEL REGIONS

Related U.S. patent application Ser. No. 08/277,719, entitled "Reduced Leakage Current Multiple Gate Thin Film Transistors," filed Jul. 20, 1994, and now abandoned and related U.S. patent application Ser. No. 08/367,984, entitled "Circuitry with Gate Line Crossing Semiconductor Line at Two or More Channels," filed Jan. 3, 1995, are both incorporated herein by reference.

BACKGROUND OF THE INVENTION

This invention relates to control of leakage current in structures such as thin film transistors (TFTs).

Kunii et al., U.S. Pat. No. 5,412,493, describe a liquid crystal display with LDD type thin film transistors connected in series. At col. 1 lines 18–23, Kunii et al. mention polycrystalline silicon as a thin film material for thin film transistors. Beginning at col. 1 line 24, Kunii et al. describe a TFT with a lightly doped drain (LDD) structure that suppresses leak current. Beginning at col. 1 line 66, Kunii et al. describe a multi-gate structure to minimize leak current of a TFT. TFTs with a polycrystalline silicon layer that includes a source region, a source/drain region, a drain region, and a pair of channel regions and with a gate electrode above each channel region are shown and described in relation to FIGS. 1–8(M). In each embodiment, lightly doped drain regions are also formed in the polycrystalline silicon layer. Col. 7 lines 39–47 explain that the effective value of leak current depends upon the one of the TFTs in series that exhibits the lowest off current, so that variation in leak current decreased significantly. FIGS. 9, 10, and 23–26 illustrate characteristics. A display is shown relation to FIG. 11. Additional embodiments are shown and described in relation to FIGS. 16–21.

Huang, U.S. Pat. No. 4,907,041, describes an intra-gate offset high voltage TFT with misalignment immunity. Huang is concerned with leakage current in high voltage TFTs when drain voltage exceeds 20 to 30 volts. At col. 1 lines 15–24, Huang describes the use of TFTs of amorphous or polycrystalline silicon as low voltage pixel addressing elements in large area flat panel displays; then Huang states that conventional low voltage MOSFET transistors are not capable of sustaining more than 20 or 30 volts before breakdown caused by gate electrode being aligned with or overlapping drain electrode.

As shown and described by Huang in relation to FIGS. 4–6, a non-single crystal semiconductor active layer, in the amorphous, microcrystalline, or polycrystalline form, is deposited on a substrate. Over it, two polysilicon gates are formed, defining an offset region in the active layer between them. A low level dopant implantation step dopes the offset region, while the offset region is masked during heavier doping of source and drain electrodes, so that the offset region is less highly doped than the source and drain electrodes. One gate serves as a conventional device control gate while the other serves as a dummy drain, and the resulting TFT may be operated in a fixed bias mode as in FIG. 5 or in a tied-gates mode as in FIG. 6. FIGS. 1 and 7 show drain current as a function of drain voltage. Curves C and D in FIG. 1 show the tied-gates mode, compared with a conventional dual-gate device shown by curves A and B. FIG. 1 also shows the low OFF-state leakage current. Because the OFF-state leakage current is limited by the source-side high voltage transistor when $V_G$ is OFF, the device in the tied-gates mode can operate as a high voltage device.

SUMMARY OF THE INVENTION

The invention addresses problems that arise in using TFTs to control connections to cell circuitry in arrays, such as light valve, sensor, or memory arrays. With conventional TFT structures, the gate bias that produces minimum leakage current varies from TFT to TFT across an array. Therefore, if a fixed gate bias is applied during each TFT's OFF state, different TFT's will experience different leakage current levels, leading to nonuniformities.

In a two-dimensional (2D) array, for example, in which scan lines extend in one direction and data lines in the other, each cell can include a TFT that controls a connection between the cell's component and a data line. The gate of each cell's TFT can receive periodic voltage pulses from a scan line. During the relatively brief time that the voltage on the scan line is high, the TFT is ON, permitting current to flow between the cell's component and the data line. During the remainder of the time, however, the TFT is OFF.

While a cell's TFT is OFF, its gate is held at a stable low voltage while the voltages on its channel leads fluctuate. One lead fluctuates with the voltage on the data line and the other lead may also fluctuate if a level of charge stored by the cell's component fluctuates. Therefore, even though the TFT remains reverse-gate-biased, the magnitude of reverse gate bias voltage can vary across a wide range. If minimum leakage current occurs at a different reverse gate bias voltage for each TFT in an array, leakage current effects will be nonuniform across the array.

The problems of varying reverse gate bias voltage are especially severe for polysilicon (poly-Si) TFTs. In conventional poly-Si TFTs, leakage current increases exponentially as reverse gate bias voltage increases in magnitude. Therefore, slight differences between TFTs in an array can produce large differences in leakage currents in response to similar reverse gate biasing signals. Since each scan line is typically connected to the gates of many TFTs, it is difficult to adjust bias to obtain minimum leakage current.

Kunii et al., described above, propose a complex LDD structure to suppress leakage current. In array applications, however, leakage current control is highly dependent on source/drain symmetry, and precise positioning of LDD regions is critical to obtain exact source/drain symmetry; in view of the cost of precise positioning, complex LDD structures may be impractical. Furthermore, LDD structures reduce ON current, leading to a difficult choice between reduced ON current or wider TFTs that would maintain ON current but would increase gate and parasitic capacitances. In a display or other light valve in which frame rate is critical, reduced ON current would reduce gray scale or color resolution, but wider TFTs would reduce aperture ratio. In a sensor, reduced ON current similarly would reduce resolution of the signal from each cell, but wider TFTs would reduce sensitivity due to capacitive coupling. Therefore, both choices are unattractive.

The invention is based on the discovery of a new technique for controlling reverse gate bias leakage current in an array with TFTs. The new technique does not require a complex LDD structure, but employs a simple multichannel structure that is easy to fabricate. The new technique eliminates the need for LDD regions-instead, each intrachannel region in a series of channels has an appropriate continuous distribution of dopant particles. Surprisingly, this technique provides excellent control over reverse gate bias leakage current, even in poly-Si TFTs, without significantly reducing TFT ON current.

The technique therefore provides an array with M scan lines and N data lines. For each of a set of pairs of values (m, n), the array includes cell circuitry connected to the nth scan line and the nth data line. The cell circuitry includes a component with a data lead for receiving signals from or providing signals to the nth data line, and connecting circuitry for electrically connecting the data lead to the nth data line under control of the mth scan line. Each cell's connecting circuitry includes a semiconductor part electrically connected between the nth data line and the data lead; the semiconductor part includes Q channels in series and (Q-1) intrachannel regions between channels, where Q is two or more. The semiconductor part can, for example, be part of a poly-Si layer.

Each cell's connecting circuitry also includes Q gate regions, each extending across the semiconductor part at one of the Q channels. Each of the Q gate regions is electrically connected to the cell's scan line so that at a first scan line voltage, such as a high voltage, the Q channels are all highly conductive, but at a second scan line voltage, such as a low voltage, the Q channels only pass leakage current. Each of the intrachannel regions has a continuous distribution of dopant particles, and, together, the dopant distributions in the intrachannel regions control reverse gate bias leakage current between the data line and the data lead without significantly reducing ON current.

The channels and gate regions can form a thin film transistor (TFT) with two or more channels. The TFT can also include channel lead regions that are conductive, one electrically connected between the cell's data line and the first channel and the other electrically connected between the Qth channel and the data lead of the cell's component. The channel lead regions can be doped at a first density while the intrachannel regions are doped at a second density less than the first. The second density can be sufficiently great, however, that ON current is approximately equal to what it would be if the first and second densities were equal.

The distribution of dopant particles in the intrachannel regions of each multiple channel TFT can ensure that the TFT's reverse gate bias leakage current is approximately constant across a range of reverse gate bias voltages. If the technique is applied to all TFTs in an array, the reverse gate bias leakage current is no longer dependent on gate voltage. Therefore, leakage current throughout the array can be uniform and low.

The component of each cell can include a capacitive element that, during operation of the array circuitry, stores a level of charge within one of two or more distinct voltage bands for a storage period. The distribution of dopant particles in the intrachannel regions of each multiple channel TFT can ensure that reverse gate bias leakage current is sufficiently low that the level of charge stored by the capacitive element remains within its voltage band during the storage period. Because the voltage bands can be held within tighter ranges, each cell can store more distinct levels than it could if it had a single channel TFT.

The array can, for example, be an active matrix display or other display, with each cell controlling presentation of a part of an image. Or the array can be a sensor array such as a page-wide scanning bar. Or the array can be a memory array, such as a static random access memory (SRAM), with each TFT functioning as a load transistor.

The technique described above is advantageous because it is inexpensive and simple to implement compared to other approaches to leakage current reduction such as LDD structures and higher numbers of channels. LDD structures lead to problems with masking and uniformity and also reduce ON current, while the technique described above can be implemented with simple masks in a way that produces uniform results without reducing ON current. The technique described above does not require critical process steps such as precise lithography, as would be necessary to produce LDD structures. Excessive doping of an intrachannel region can be prevented with a mask that covers the entire intrachannel region and slightly overlaps adjacent features, so that precise alignment is unnecessary. Higher numbers of channels lead to problems with increased capacitance and are difficult to implement without increasing device size, but the technique described above is nonetheless effective.

The technique described above is also advantageous because it can be used to produce a poly-Si TFT whose leakage current is independent of gate bias at all the negative gate biases in the range of interest. The reverse gate bias leakage current depends only on drain bias. Because the TFT's reverse gate bias leakage current is approximately constant across a broad range of negative gate biases, the TFT can be applied in a display that employs more advanced driving techniques that involve larger equivalent negative gate biases yet require more constrained leakage currents than would be possible with a conventional poly-Si TFT. For example, the TFT can be driven at a greater number of levels, such as a greater number of grey levels.

The technique described above is also advantageous because it alleviates non-uniformities that preclude adjustment of gate bias to obtain minimum leakage. Conventional poly-Si TFTs will vary across an array or between arrays in ways that change the gate bias at which leakage is minimum. In other words, the optimal gate bias differs from TFT to TFT and from array to array. With the technique described above, however, if a worst case reverse gate bias operating condition can be identified for the poly-Si TFTs, and if the leakage current under the worst case operating condition can be held below a known maximum, then these non-uniformities will not change the gate bias at which leakage is a minimum.

The following description, the drawings, and the claims further set forth these and other aspects, objects, features, and advantages of the invention.

DETAILED DESCRIPTION

A. Conceptual Framework

Figure 1:
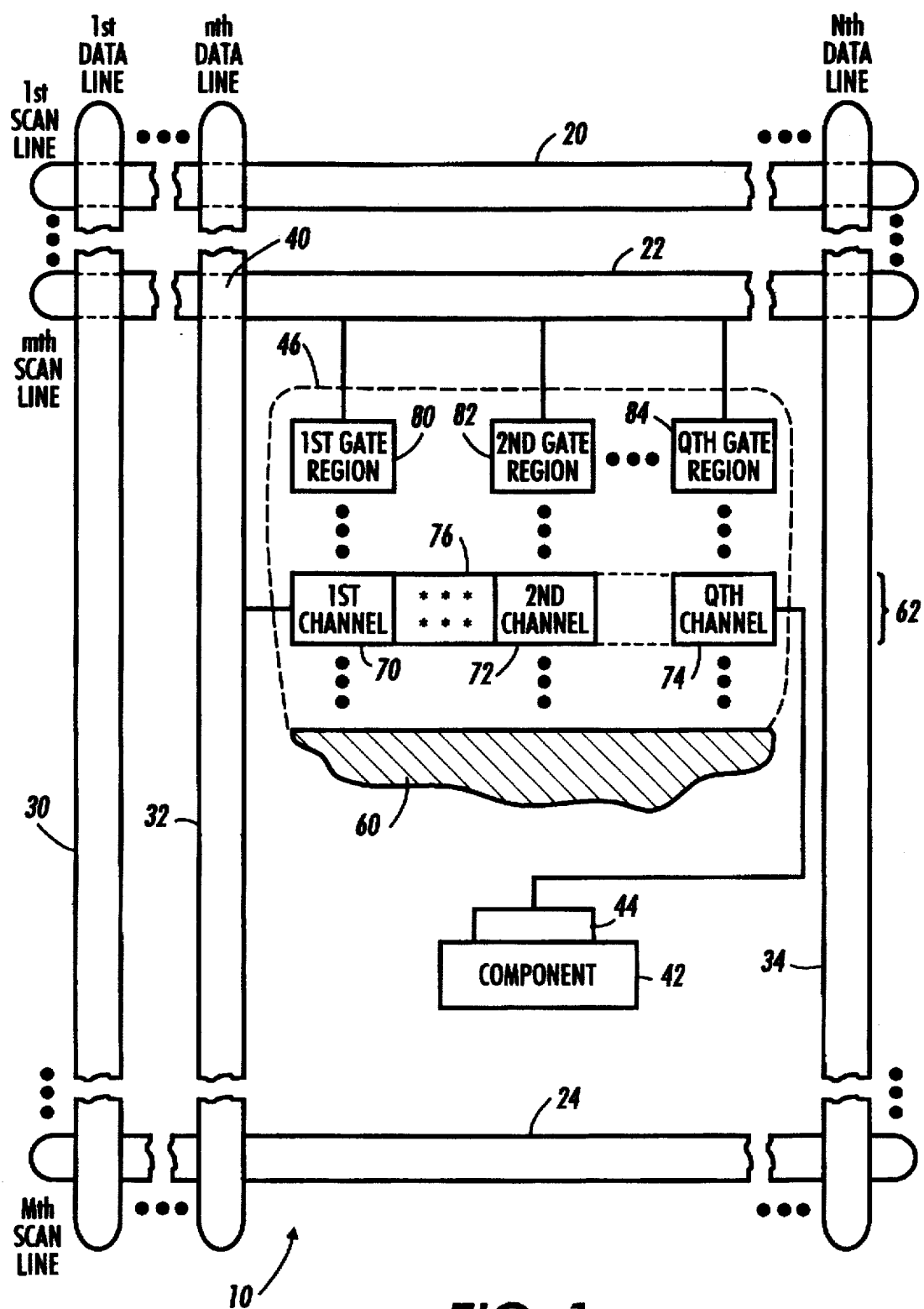
FIG. 1 is a schematic diagram of an array in which each cell includes a multiple channel structure with intrachannel regions that have continuous distributions of dopant particles.

The following conceptual framework is helpful in understanding the broad scope of the invention, and the terms defined below have the indicated meanings throughout this application, including the claims.

"Circuitry" or a "circuit" is any physical arrangement of matter that can respond to a first signal at one location or time by providing a second signal at another location or time, where the timing or content of the second signal includes information about timing or content of the first signal. Circuitry "transfers" a first signal when it receives the first signal at a first location and, in response, provides the second signal at a second location.

Any two components are "connected" when there is a combination of circuitry that can transfer signals from one of the components to the other. For example, two components are "connected" by any combination of connections between them that permits transfer of signals from one of the components to the other. Two components are "electrically connected" when there is a combination of circuitry that can transfer electric signals from one to the other. Two components could be electrically connected even though they are not in physical contact, such as through a combination of conductive components that are electrically connected between them.

A "substrate" or "chip" is a unit of material that has a surface at which circuitry can be formed or mounted. An "insulating substrate" is a substrate through which no electric current can flow.

A "layer" is a thickness of material formed over a surface and extending generally parallel to the surface, with one side toward the surface and another side away from the surface. A layer may be homogeneous or its composition may vary.

A "polysilicon layer" is a layer that includes predominantly polycrystalline silicon.

An "electric circuit" is a circuit within which components are electrically connected. An "electric structure" is a physical structure that includes one or more electric circuits.

An operation "deposits" a layer by depositing material to form the layer, such as by physical or chemical vapor deposition.

To "etch" is to remove parts of one or more layers of material.

To perform "lithography" or to "lithographically pattern" is to use a radiation source to transfer a mask pattern to a layer of radiation-sensitive material and then to develop the radiation-sensitive material to obtain a positive or negative copy of the mask pattern. The transferred pattern that results from development may be referred to as a "pattern of mask material" or simply a "mask" if it is to be used for etching.

A "thin-film structure" is an electric structure that is formed at a surface of an insulating substrate. A thin-film structure could be formed, for example, by deposition and patterned etching of films on the insulating substrate's surface.

In an electric structure formed at a surface, a part of a first layer "covers" or "has a shape that covers" or "is over" a part of a second layer if the part of the second layer is between the part of the first layer and the surface.

If a part of a first layer covers a part of a second layer in a region and each of the parts also extends outside the region, each of the parts "extends across" the other.

An "integrated circuit" is a circuit formed at a substrate's surface by batch processes such as deposition, lithography, etching, oxidation, diffusion, implantation, annealing, and so forth.

A "lead" is a part of a component at which the component is electrically connected to other components. A "line" is a simple component that extends between and electrically connects two or more leads. A line is "connected between" the components or leads it electrically connects. A lead of a component is "connected" to a lead of another component when the two leads are electrically connected, such as by a combination of leads and lines. In an integrated circuit, leads of two components may also be "connected" by being formed as a single lead that is part of both components.

The terms "array" and "cell" are related: An "array" is an article of manufacture that includes an arrangement of "cells." For example, a "two-dimensional array" or "2D array" includes an arrangement of cells in two dimensions. A 2D array of circuitry may include rows and columns, with a line for each row and a line for each column. Lines in one direction may be "data lines" through which a cell receives or provides signals that determine or indicate its state. Lines in the other direction may be "scan lines" through which a cell receives a signal enabling it to receive signals from or provide signals to its data line.

In an array of circuitry, "cell circuitry" is circuitry connected to a cell's scan line and data line.

A "channel" is a part of a component through which flow of electric current depends on the channel's state. A channel is "highly conductive" or "ON" when the channel is in a state in which current can flow freely through it. A channel is "OFF" when the channel is in a state in which very little current can flow through it. A current through a channel that is ON is called an "ON current." Any current that flows through a channel that is OFF is called "leakage current."

Two or more channels are "in series" with each other if they are electrically connected so that all must be ON for current to flow freely through any of the channels and if freely flowing current flows at approximately the same level through all channels at once.

A part of a layer includes a "series of" two or more channels if the layer includes two or more channels that are in series.

A "channel lead" is a lead that connects to a channel or, for channels in series, to a channel at an end of the series. A series of channels may, for example, extend between two channel leads.

A part of a layer that includes a series of channels is "connected between" a first component or lead and a second component or lead if the series of channels extends between two channel leads, and one channel lead is electrically connected to the first component or lead while the other channel lead is electrically connected to the second component or lead.

An "intrachannel region" is a region between two channels in a series.

A "charge carrier" is a real or fictitious particle that can transport charge to produce a current; electrons and holes are examples of charge carriers. A "charge carrier source" is an ion, atom, molecule, or other feature that can provide a charge carrier. A "charge carrier destination" is an ion, atom, molecule, or other feature that can neutralize or stop movement of a charge carrier. In an integrated circuit, an "n-channel" is a channel for which the majority of charge carrier sources provide charge carriers of negative sign such as electrons; a "p-channel" is a channel for which the majority of charge carrier sources provide charge carriers of positive sign such as holes.

A "dopant particle" or "dopant" is an ion, atom, molecule, or other particle that can be added to a channel or other part of an integrated circuit during production and that serves as a charge carrier source when the integrated circuit is in use. An "n-type dopant" provides charge carriers of negative sign and a "p-type dopant" provides charge carriers of positive sign.

A process "implants" a dopant if the process causes particles of the dopant to enter a part of an integrated circuit.

A layer or part of a layer is "doped" if it contains an implanted dopant.

A "distribution of dopant particles" is a function that relates local density of dopant particles to position within a doped layer or part of a layer.

An "average dopant density" is a mean of dopant densities within a doped layer or part of a layer, and could be approximated by dividing the total number of dopant particles in the doped layer or part of a layer by the volume of the layer or part of a layer.

An intrachannel region has a "continuous distribution" of dopant particles if it does not include any internal boundaries between regions with different densities of dopant particles.

An intrachannel region is "uniformly doped" if it has a continuous distribution of dopant particles and if local density of dopant particles is approximately equal to its average dopant density for all reasonably sized volumes within the intrachannel region.

A set of intrachannel regions has a distribution of dopant particles that is "approximately uniform" if each of the intrachannel regions is uniformly doped and if each of the intrachannel regions has approximately the same average dopant density.

A "transistor" is a component that has a channel or a series of channels that extends between two channel leads, and that also has a third lead-referred to as a "gate lead" or simply "gate" -such that the channel or series of channels can be switched between ON and OFF by signals that change potential difference between the gate and one of the channel leads, referred to as the "source." The channel lead that is not the source is referred to as the "drain." Other components may have leads called gates, sources, and drains by analogy to transistors.

Signals to a part of a layer "control conductivity" of a channel if the signals can change conductivity of the channel. Such a part may be called a "gate region" and the signals may be called "gate signals."

A "thin-film transistor" or "TFT" is a transistor that is part of a thin film structure.

A "reverse gate bias voltage" of a channel or series of channels or a TFT is a potential difference between gate and source, $V_{GS}$, at which the channel or series of channels or TFT is OFF. A channel or series of channels or a TFT is "reverse gate biased" when the potential difference between gate and source is a reverse gate bias voltage. An n-type enhancement mode field-effect TFT is reverse gate biased when $V_{GS}<0$, while a p-type enhancement mode field-effect TFT is reverse gate biased when $V_{GS}>0$.

Any current that flows through a reverse gate biased channel or series of channels or a reverse gate biased TFT is "reverse gate bias leakage current."

An "operational limit" on reverse gate bias leakage current is a limit imposed by the manner in which circuitry is used. For example, in an array in which each cell includes a channel or series of channels or a TFT that electrically connects a capacitive element to a data line under control of a scan line, if the capacitive element stores a level of charge within one of two or more distinct voltage bands for a storage period, leakage current must be sufficiently low that the level of charge remains within its voltage band during the storage period.

Reverse gate bias leakage current "does not increase significantly across a range of reverse gate bias voltages" if the maximum magnitude of reverse gate bias leakage current that occurs in the range does not exceed ten times the minimum magnitude of reverse gate bias leakage current that occurs in the range, assuming all other parameters are constant.

A distribution of dopant densities in a set of intrachannel regions "controls reverse gate bias leakage current" through a series of channels or through a TFT if the distribution ensures that reverse gate bias leakage current does not increase significantly across a range of reverse gate bias voltages that occur during operation and does not exceed any operational limits on reverse gate bias leakage current.

A distribution of dopant particles in a set of intrachannel regions "does not significantly reduce ON current" through a series of channels or through a TFT if the distribution ensures that ON current through the series of channels or through the TFT is at least half as great as the ON current that would flow if the intrachannel region were doped to be at least as conductive as the channel leads, assuming all other parameters are constant.

Two components are electrically connected "under control of" a line if a signal on the line can change conductivity of a third component connected between the two components so that the two components are electrically connected. For example, circuitry that includes a channel or series of channels can electrically connect two components under control of a line that is electrically connected to one or more gate regions that control conductivity of the channel or series of channels.

A "capacitive element" is a component that stores a level of charge. A capacitive element may include two conductive components, called "electrodes," separated by an insulating layer.

In a 2D array of circuitry, a cell's area may include a "cell electrode." A cell electrode may serve as one electrode of a capacitor whose other electrode is external to the array.

An "image" is a pattern of physical light in any part of the electromagnetic spectrum.

A "light valve array" is a device that includes an array of cells that can produce an image in light passing through or reflected from the array.

An "image output device" is a device that can provide output defining an image.

A "display" is an image output device that provides information in a visible form. A display may be implemented, for example, with a light valve array.

An "image input device" is a device that can receive input defining an image.

A "sensor array" is an image input device that receives information in the form of an image detected by an array of sensors.

"Memory circuitry" or "memory" is any circuitry that can store physical signals indicating or including information. A "memory cell" is memory circuitry that can store a single unit of data, such as a bit or other n-ary digit or an analog value. A "memory array" is memory circuitry that includes an array of memory cells.

B. General Features

Figure 2:
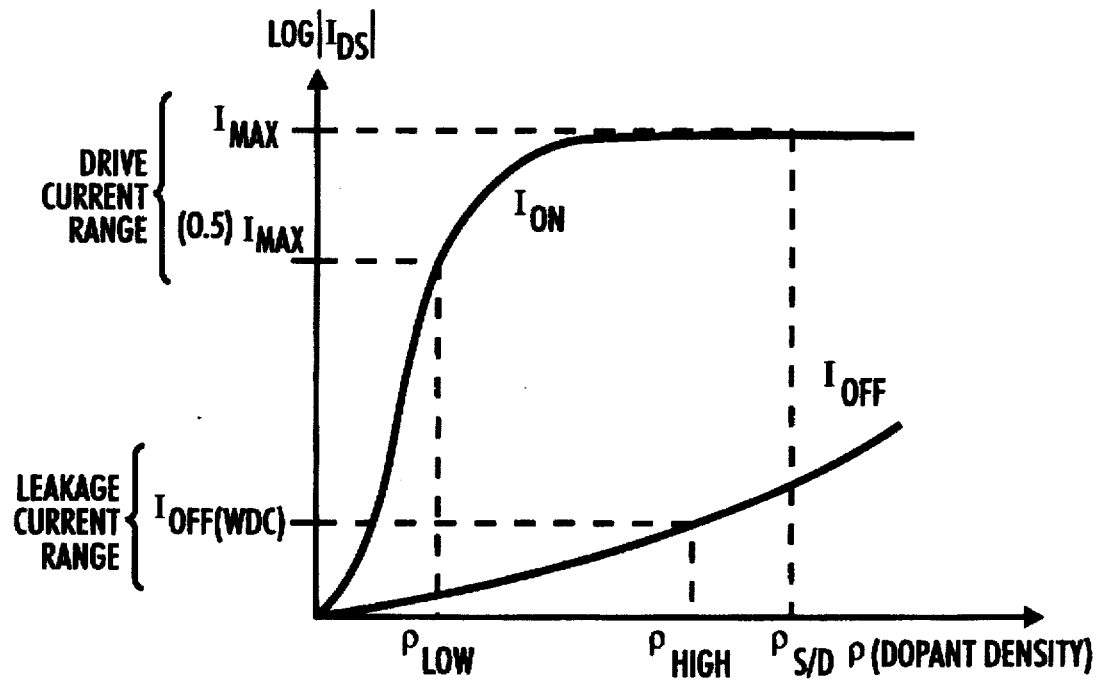
FIG. 2 is a graph showing maximum ON current and maximum reverse gate bias leakage current as a function of dopant density in the intrachannel regions of FIG. 1.
Figure 3:
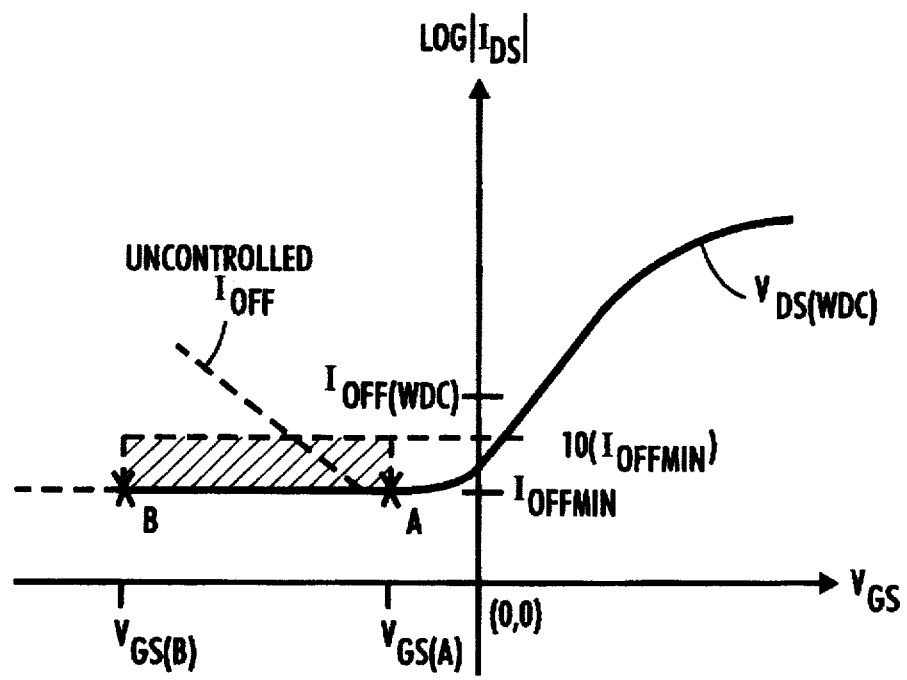
FIG. 3 is a graph showing an example of drain-to-source current as a function of gate-to-source voltage for a structure like that in FIG. 1.
Figure 4:
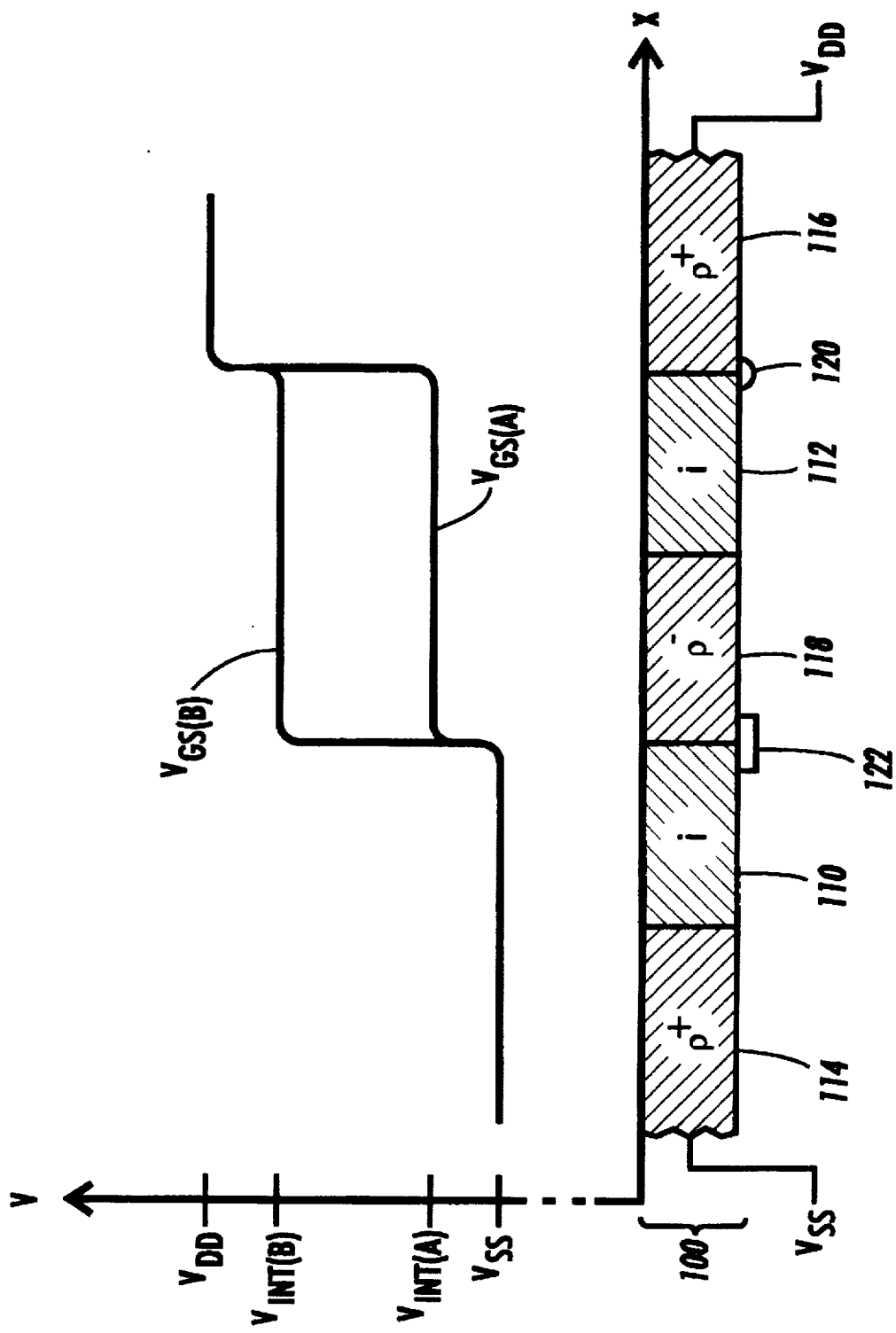
FIG. 4 is a combined schematic diagram and graph illustrating how distribution of dopant particles in intrachannel regions may control leakage current at different reverse gate biases in a structure like that of FIG. 1.

FIGS. 1-4 illustrate general features of the invention. FIG. 1 shows an array in which each cell includes a multiple channel structure with intrachannel regions that have continuous distributions of dopant particles. FIG. 2 shows how maximum ON current and maximum reverse gate bias leakage current vary as a function of dopant density in the intrachannel regions of FIG. 1. FIG. 3 shows how current varies as a function of gate-to-source voltage for the structure of FIG. 1. FIG. 4 shows how leakage current may be controlled across a range of reverse gate biases in the structure of FIG. 1.

Array circuitry 10 in FIG. 1 illustratively includes M scan lines 20, 22, through 24 and N data lines 30, 32, through 34. Cell circuitry connected to mth scan line 22 and nth data line 32, which cross in crossing region 40, includes component 42 which has data lead 44 for receiving signals from or providing signals to nth data line 34. Connecting circuitry 46, shown in schematic cross section, electrically connects data lead 44 to nth data line 32 under control of mth scan line 22.

Connecting circuitry 46 includes layers of a structure formed on substrate 60. Part 62 is a part of a semiconductor layer. Part 62 is electrically connected between nth data line 32 and data lead 44. Other layers include gate regions, each of which is electrically mth scan line 22.

Part 62 includes a series of Q channels 70, 72, through 74 and also includes (Q-1) intrachannel regions, with FIG. 1 illustratively showing intrachannel region 76 between first channel 70 and second channel 72. In other words, part 62 includes an intrachannel region between each pair of adjacent channels in the series of Q channels 70, 72, through 74. Each of the (Q-1) intrachannel regions has a continuous distribution of dopant particles, meaning that it does not include any internal boundaries between regions with different densities of dopant particles.

Each of Q gate regions 80, 82, through 84 is part of a layer other than the semiconductor layer that includes part 62. Each gate region extends across part 62 at one of the channels, with gate region 80 extending across channel 70, gate region 82 across channel 72, and gate region 84 across channel 74. Each of gate regions 80, 82, through 84 is electrically connected to mth scan line 22.

Therefore, when mth scan line 22 is at a first voltage, channels 70, 72, through 74 are all highly conductive, providing an electrical connection between nth data line 32 and data lead 44. On the other hand, when mth scan line 22 is at a second voltage, channels 70, 72, through 74 only pass leakage current between nth data line 32 and data lead 44. In enhancement mode, for example, the first voltage would be a high or ON voltage, and the second voltage would be a low or OFF voltage.

Part 62 also includes dopant particles in intrachannel regions, illustrated by asterisks in intrachannel region 76.

Each intrachannel region has a continuous distribution of dopant particles, and, together, the distribution controls leakage current between nth data line 32 and data lead 44 when channels 70, 72, through 74 are reverse gate biased and that does not significantly reduce current when channels 70, 72, through 74 are all highly conductive.

The graph in FIG. 2 shows how ON current ION and reverse gate bias leakage current $I_{OFF}$ vary during operation of array circuitry 10 as a function of dopant density $\rho$ in the intrachannel regions. The magnitudes of $I_{ON}$ and $I_{OFF}$ are plotted against a logarithmic coordinate axis that includes an upper range for currents in the drive current range and a lower range for currents in the leakage current range. For poly-Si TFTs, for example, useful drive current ranges may be in the microamp to milliamp range, while useful leakage current ranges may be in the sub-picoamp to nanoamp range, with the precise ranges depending on W/L ratio and other parameters. In general, the drive current range and the leakage current range should be separated by five or more orders of magnitude for an adequate signal-to-noise ratio.

As shown, $I_{ON}$ increases steeply as $\rho$ increases from zero, quickly reaches the upper range, and eventually reaches the value $I_{MAX}$ when $\rho=\rho S/D$, the density at which the the conductivity of the intrachannel regions is as great as the conductivity of channel leads, sometimes referred to as source/drain leads, that connect to nth data line 32 and data lead 44. For most applications, values of $I_{ON}$ greater than $(0.5)I_{MAX}$ are satisfactory, and dopant density $\rho LOW$, at which $I_{ON}=(0.5)I_{MAX}$, is therefore not considered to significantly reduce $I_{ON}$.

$I_{OFF}$ also increases from zero but remains within the lower, leakage current range. For satisfactory operation with a given driving technique, however, $I_{OFF}$ must not exceed $I_{OFF("WDC")}$, the maximum permissible leakage current that can occur under the worst-case driving condition ("WDC") for that driving technique.

Typically, component 42 includes a capacitive element that stores a level of charge within one of two or more distinct voltage bands for at least a minimum storage period. Reverse gate bias leakage current is one of a number of factors that determine whether the capacitive element is capable of holding a level of charge within its band for the minimum storage period—other factors include, for example, the size of the capacitive element, which can depend on the capacitance of the liquid crystal in a liquid crystal display; the length of the storage period, referred to as the frame rate in a display; the gate-to-source capacitance; other leakage currents, such as leakage current through the liquid crystal; and so forth.

The WDC of a given driving technique, then, is the condition under which the combined effect of all relevant factors makes it most difficult for the capacitive element to hold a level of charge for the minimum storage period. If reverse gate bias leakage current exceeds $I_{OFF(WDC)}$, the capacitive element will fail to hold a level of charge within its band for the minimum storage period when WDC occurs, resulting in loss of information.

FIG. 2 shows how $I_{OFF}$ remains below $I_{OFF}(WDC)$ at dopant densities below $\rho_{HIGH}$, at which $I_{OFF}=I_{OFF(WDC)}$. Therefore, for $\rho_{LOW}<\rho<\rho_{HIGH}$, $I_{OFF}$ is less than $I_{OFF(WDC)}$ while $I_{ON}$ is greater than $(0.5)I_{MAX}$ and therefore is not significantly reduced from $I_{MAX}$.

FIG. 3 shows how $I_{OFF}$ varies as a function of gate-to-source voltage $V_{GS}$ if the distribution of dopant particles in intrachannel regions controls leakage current. The values of $I_{OFF}$ shown in FIG. 3 occur at the WDC drain-to-source voltage $V_{DS(WDC)}$. The dashed line at the left of the vertical axis shows that, if leakage current is uncontrolled, $I_{OFF}$ rises exponentially to a current greater than $I_{OFF(WDC)}$ as $V_{GS}$ rises to greater negative values. This would occur, for example, if all intrachannel regions in semiconductor part 62 were uniformly doped to the level $\rho_{S/D}$ shown in FIG. 2.

A distribution of dopant particles in intrachannel regions can, however, control reverse gate bias leakage current. FIG. 3 shows a range of reverse bias gate voltages, from $V_{GS(A)}$, at which $I_{OFF}$ has its minimum level, $I_{OFFMIN}$, to $V_{GS(B)}$, the WDC gate-to-source voltage. Across the range from $V_{GS(A)}$ to $V_{GS(B)}$, $I_{OFF}$ does not increase above $10(I_{OFFMIN})$, ten times its minimum level. As long as $I_{OFF}$ remains within the shaded region above the line from A to B, reverse gate bias leakage current is controlled and remains within an order of magnitude. The line between points A and B illustrates that $I_{OFF}$ could be approximately constant at $I_{OFFMIN}$ across the entire range.

FIG. 4 illustrates the mechanism by which distribution of dopant particles in an intrachannel region is believed to control reverse gate bias leakage current. In the graph in FIG. 4, the horizontal axis measures position in the x direction from the source to the drain of part 100, a part of a semiconductor layer that illustratively includes heavily doped channel lead regions. The vertical axis measures voltage, which varies from $V_{SS}$, the source voltage, to $V_{DD}$, the drain voltage.

Part 100 includes two undoped channels, channel 110 and channel 112, each of which is marked "i" for "intrinsic". Channel lead 114 is connected to the source voltage $V_{SS}$ and is marked $\rho+$ to indicate that it has a high density of dopant particles. Channel lead 116 is similarly connected to the drain voltage $V_{DD}$ and is similarly marked $\rho+$ to indicate a high dopant density. Intrachannel region 118, on the other hand, is marked $\rho-$ to indicate that it has a low density of dopant particles, where $0<\rho-<\rho+$.

Part 100 has two junction depletion regions across which a voltage difference can be sustained because tunneling of holes is inhibited, with the source-to-drain current $I_{DS}$ being determined by the less conductive of the two: Depletion region 120 occurs at the junction of channel lead 116 and channel 112. Depletion region 122 occurs at the junction of intrachannel region 118 and channel 110. Because they are in series, the current through depletion regions 120 and 122 must be approximately equal, assuming other leakage mechanisms are controlled. But the voltage drop across depletions regions 120 and 122 changes at different values of gate-to-source voltage $V_{GS}$.

When the gate-to-source voltage is greater than or equal to $V_{GS(A)}$, as shown in FIG. 3, channel 110 is highly conductive so that the voltage drop across depletion region 122 is just great enough to permit current to flow. For typical poly-Si TFT implementations, this will typically occur for $V_{GS}>-2$ V, as described in Sturm, J. C., Wu, I.-W., and Hack, M., "Leakage Current Modeling of Series-Connected Thin Film Transistors," IEEE *Transactions on Electron Devices*, Vol. 42, No. 8, August 1995, pp. 1561-1563. In this regime, depletion region 120 is less conductive than depletion region 122 and actual source-to-drain current is limited because of limited tunneling of holes in depletion region 120. Therefore, ON current and leakage current in this regime are determined by the voltage drop across depletion region 120, which can be very high for high positive values of $V_{GS}$, but which will reach its minimum at $V_{GS(A)}$, at which the two depletion regions 120 and 122 have voltage drops such that they are equally conductive.

The WDC gate-to-source voltage, represented by $V_{GS(B)}$ in FIG. 3, is significantly more negative than $V_{GS(A)}$. Assuming drain voltage $V_{DD}$ and source voltage $V_{SS}$ are held constant, channels 110 and 112 pass only leakage current for $V_{GS(B)}$ and for other values of $V_{GS}<V_{GS(A)}$. In this regime, depletion region 122 at the drain end of channel 110 can become less conductive than depletion region 120. As hole tunneling increases in depletion region 120, voltage drop across depletion region 120 decreases, and the voltage drop across depletion region 122 therefore increases. At sufficiently large negative values of $V_{GS}$, the large voltage drop across depletion region 122 thus causes high field effects that become the dominant cause of leakage current.

If intrachannel region 118 has a high dopant density, such as $\rho^+$, the log of the magnitude of drain-to-source current IDS through part 100 would have the same slope in the reverse gate bias region as it would for a single channel TFT. Furthermore, structures with progressively higher numbers of channels also have the same reverse gate bias leakage current slope as a single gate device, as shown by the dashed line for uncontrolled $I_{OFF}$ in FIG. 3, since the point of highest channel electric field always moves to the drain side of the channel nearest to the source, and since the junction in the resulting depletion region has the same dopant density difference as all of the other junctions.

But if intrachannel region 118 has a dopant density $\rho^-$, less than $\rho_{HIGH}$, $I_{DS}$ remains below $I_{OFF(WDC)}$, as shown in FIG. 2, and at appropriate values of $\rho^-$, $I_{DS}$ is controlled across a range of reverse gate bias voltages, as shown in FIG. 3. The relatively small difference in dopant density across the junction between channel 110 and intrachannel region 118 spreads the voltage drop across depletion region 122 across a longer distance than it would be spread across depletion region 120, as suggested by the relative sizes of depletion regions 120 and 122 in FIG. 4. Therefore, the electric field in depletion region 122 is also spread, limiting hole tunneling in depletion region 122 and therefore limiting actual source-to-drain current, the dominant component of reverse gate bias leakage current for $V_{GS}$(B). For example, if depletion region 120 were 0.2 μm long and depletion region 122 were 1 μm long, for example, peak electric field would be reduced by a factor of five, and hole tunneling which changes exponentially as a function of peak electric field, would be very greatly reduced.

C. Implementations

The general features described above could be implemented in numerous ways. An implementation described below is suitable for an AMLCD array, and is based on an implementation described in copending, coassigned U.S. patent application Ser. Nos. 08/367,984, entitled "Circuitry With Gate Line Crossing Semiconductor Line at Two or More Channels" ("the Crossing Lines Application"), and 08/367,983, now issued as U.S. Pat. No. 5,557,534 entitled "Forming Array With Metal Scan Lines to Control Semiconductor Gate Lines," both incorporated herein by reference.

C. 1. Array Circuitry

Figure 5:
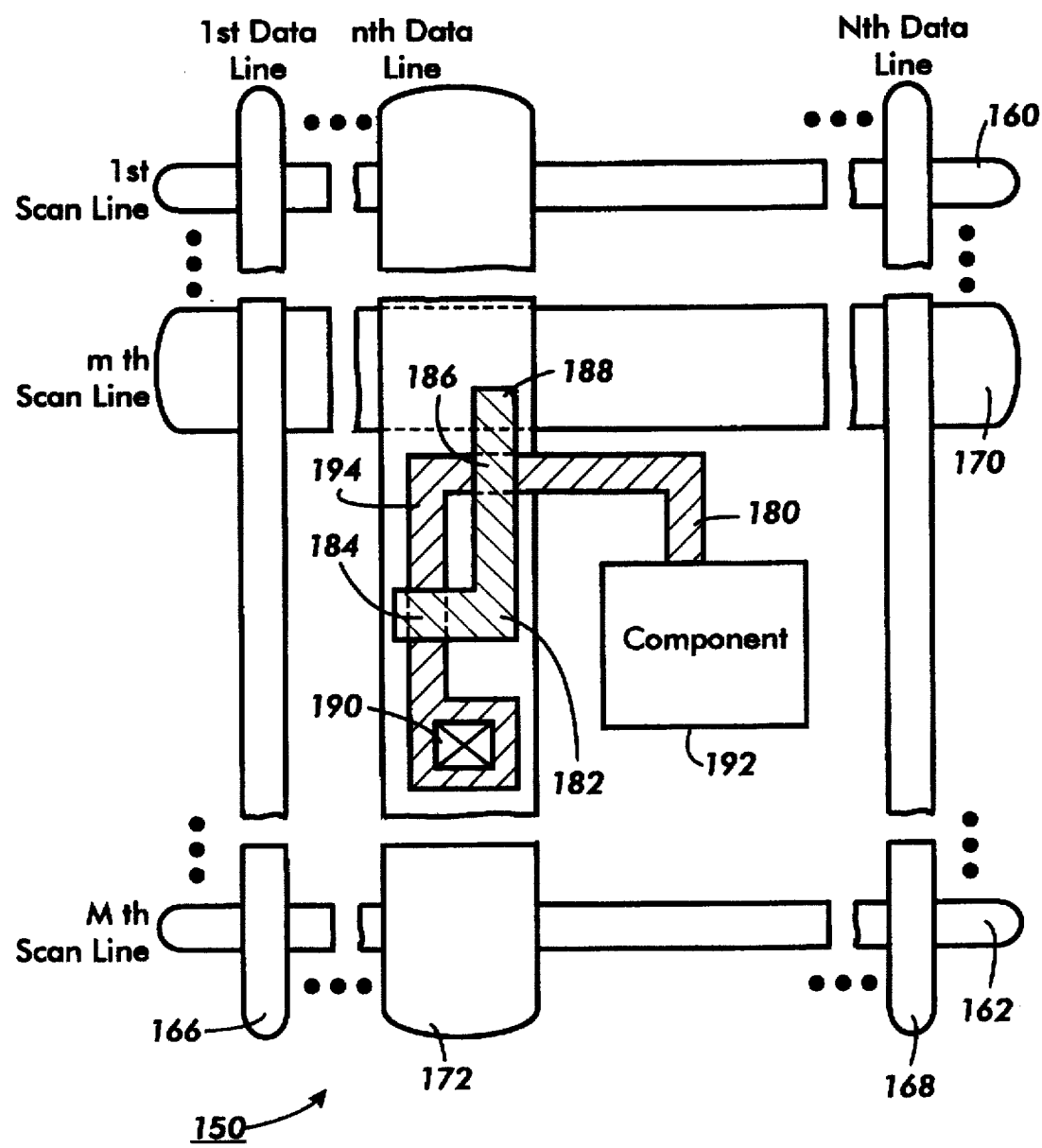
FIG. 5 is a schematic diagram of an implementation of an array in which each cell includes a two-channel polysilicon (poly-Si) TFT with an intrachannel region that has a continuous distribution of dopant particles.

FIG. 5 shows an array in which the general features described above can be implemented.

Array 150 in FIG. 5 includes M scan lines, from first scan line 160 through Mth scan line 162, and N data lines, from first data line 166 through Nth data line 168. Cell circuitry connected to mth scan line 170 and nth data line 172 is illustratively shown in more detail.

As shown in FIG. 5, polyo-Si part 180 and conductive line 182, which can be a heavily doped poly-Si line, form a Crossed-L configuration, with line 182 crossing part 180 at channels 184 and 186. Line 182 has end 188 electrically connected to mth scan line 170, which provides a gate signal. The regions of line 182 that extend across channels 184 and 186 therefore serve as gate regions.

Poly-Si part 180 is connected between data line connecting point 190, which can include a through metal connection, and a data lead of component 192. In the illustrated implementation line 182 is conductive, and the gate signal on mth scan line 170 controls conductivity of part 180 between connecting point 190 and the data lead of component 192. If the voltage on mth scan line 170 is high, channels 184 and 186 are both highly conductive, but if the voltage on mth scan line 170 is low, channels 184 and 186 only pass leakage current.

Poly-Si part 180 also includes intrachannel region 194 between channels 184 and 186. As described in more detail below, the distribution of dopant particles in intrachannel region 194 controls reverse gate bias leakage current but does not significantly reduce ON current.

C.2. Cell Circuitry

Figure 6:
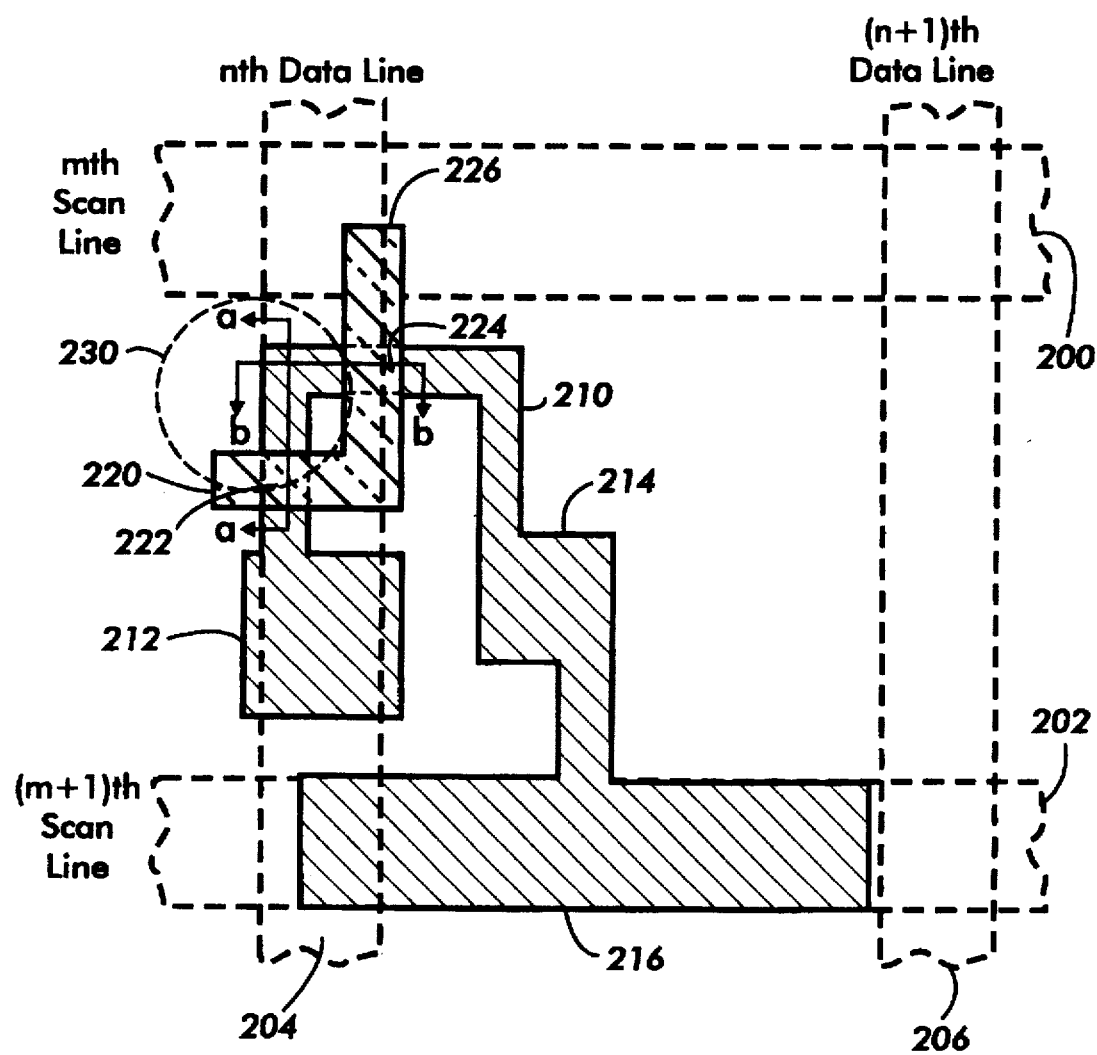
FIG. 6 is a schematic layout diagram of first and second poly-Si layers in one cell's circuitry in FIG. 5.
Figure 7:
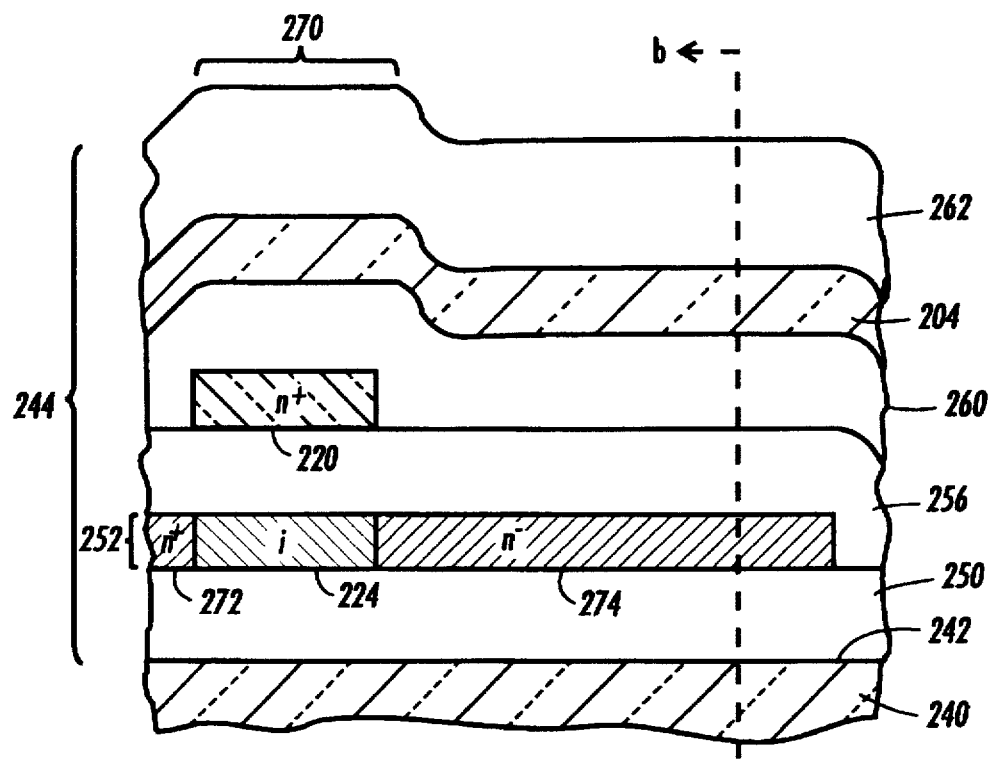
FIG. 7 is a cross section of the cell circuitry of FIG. 6 along the line a—a.
Figure 8:
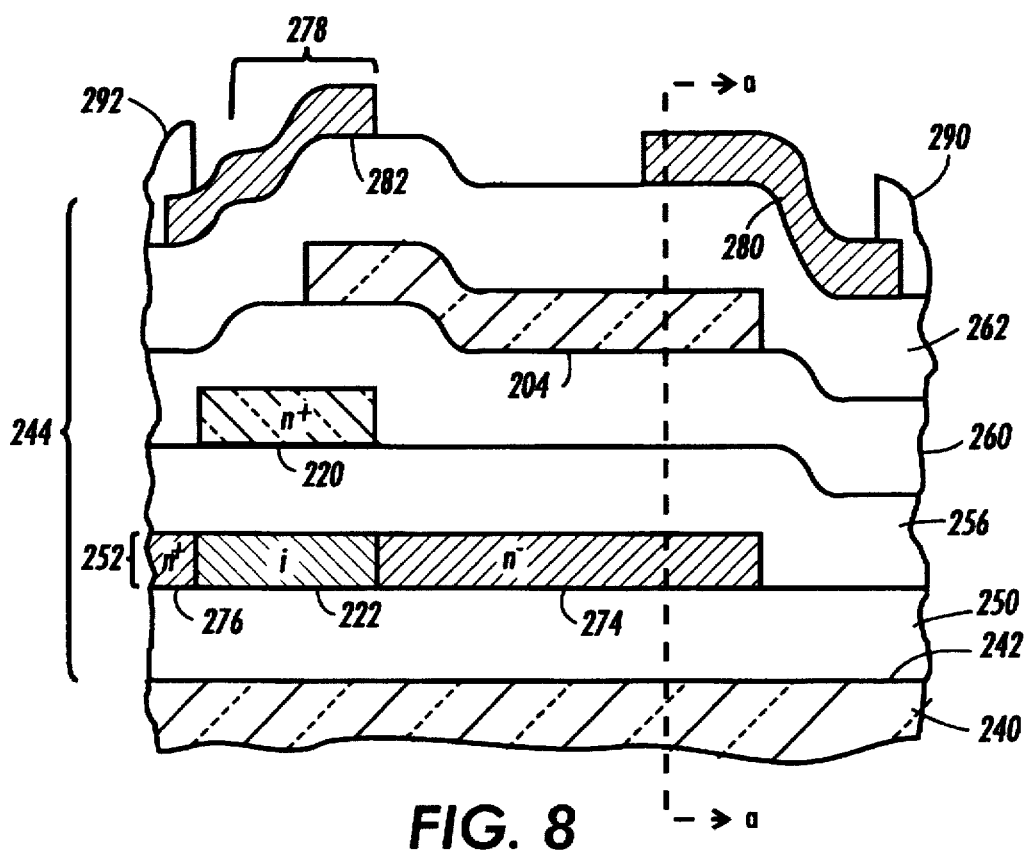
FIG. 8 is a cross section of the cell circuitry of FIG. 6 along the line b—b.

FIGS. 6–8 illustrate cell circuitry that can be used to implement the array of FIG. 5. FIG. 6 shows a layout of first and second poly-Si layers in the cell circuitry. FIGS. 7 and 8 show representative cross sections of cell circuitry in FIG. 6, along lines a—a and b—b, respectively. Additional details about the cell circuitry can be understood from FIGS. 9–13 of the Crossing Lines Application and the accompanying description, incorporated herein by reference.

FIG. 6 shows part of array 150, with mth scan line 200, (m+1)th scan line 202, nth data line 204, and (n+1)th data line 206 in dashed lines. FIG. 6 also shows part of the cell circuitry for the cell that is connected to mth scan line 200 and nth data line 204.

The cell's circuitry includes first poly-Si pattern 210, with a part that extends from first connecting point 212 to second connecting point 214 and with a line extending from second connecting point 214 to capacitor electrode 216.

The cell's circuitry also includes second poly-Si pattern 220, a line that crosses first poly-Si pattern 210 at channels 222 and 224. Second poly-Si pattern 220 extends from end 226, at which it is electrically connected to mth scan line 200.

FIG. 6 also shows light doping region 230, a region that is masked during high density doping. As a result, the part of poly-Si pattern 210 that extends between channels 222 and 224 can remain lightly doped. Second poly-Si pattern 220 also acts as a shield during high density doping, so that channels 222 and 224 can remain undoped. For ease of fabrication, the mask over light doping region 230 can slightly overlap second polyo-Si pattern 220 as shown in FIG. 6.

FIG. 7 is a cross section that shows substrate 240, which can be quartz or glass, with surface 242 at which circuitry 244 is formed. Circuitry 244 includes insulating layer 250 on surface 242, on which poly-Si part 252, part of first poly-Si pattern 210 shown in FIG. 6, is formed for the cell circuitry connected to mth scan line 200 and nth data line 204 respectively.

Circuitry 244 also includes insulating layer 256 between poly-Si part 252 and second poly-Si pattern 220 shown in FIG. 6. Second poly-Si pattern 220 also includes heavily n-doped poly-Si, and is electrically connected to mth scan line 200.

Circuitry 244 then includes insulating layer 260 separating second poly-Si pattern 220 from nth data line 204. Over nth data line 204 is passivation layer 262 of polyimide.

In FIG. 7, poly-Si part 252 includes channel lead region 272, channel 224, and intrachannel region 274. Channel lead region 272 includes heavily n-doped poly-Si, as indicated by "n+". Channel 224 is under second poly-Si pattern 220 and is therefore undoped, intrinsic poly-Si, as indicated by "i." Intrachannel region 274 includes lightly n-doped poly-Si, as indicated by "n−". Second poly-Si pattern 220 provides signals from mth scan line 200 to channel region 270, controlling conductivity of channel 224.

FIG. 8 is another cross section that crosses that of FIG. 7 at line b—b and therefore has the same layers as described above. In addition, dark matrix lines 280 and 282 are formed on passivation layer 262 over the edges of nth data line 204, and indium tin oxide (ITO) pixel electrodes 290 and 292 slightly overlap dark matrix lines 280 and 282.

In FIG. 8, poly-Si part 252 includes channel lead region 276, channel 222, and intrachannel region 274. Channel lead region 276 includes heavily n-doped poly-Si, as indicated by "n+". Channel 222 is under second poly-Si pattern 220 and is therefore undoped, intrinsic poly-Si, as indicated by "i." Intrachannel region 274 is the same as in FIG. 7. Second poly-Si pattern 220 also provides signals from mth scan line 200 to channel region 278, controlling conductivity of channel 222.

C.3. Fabrication

Figure 9:
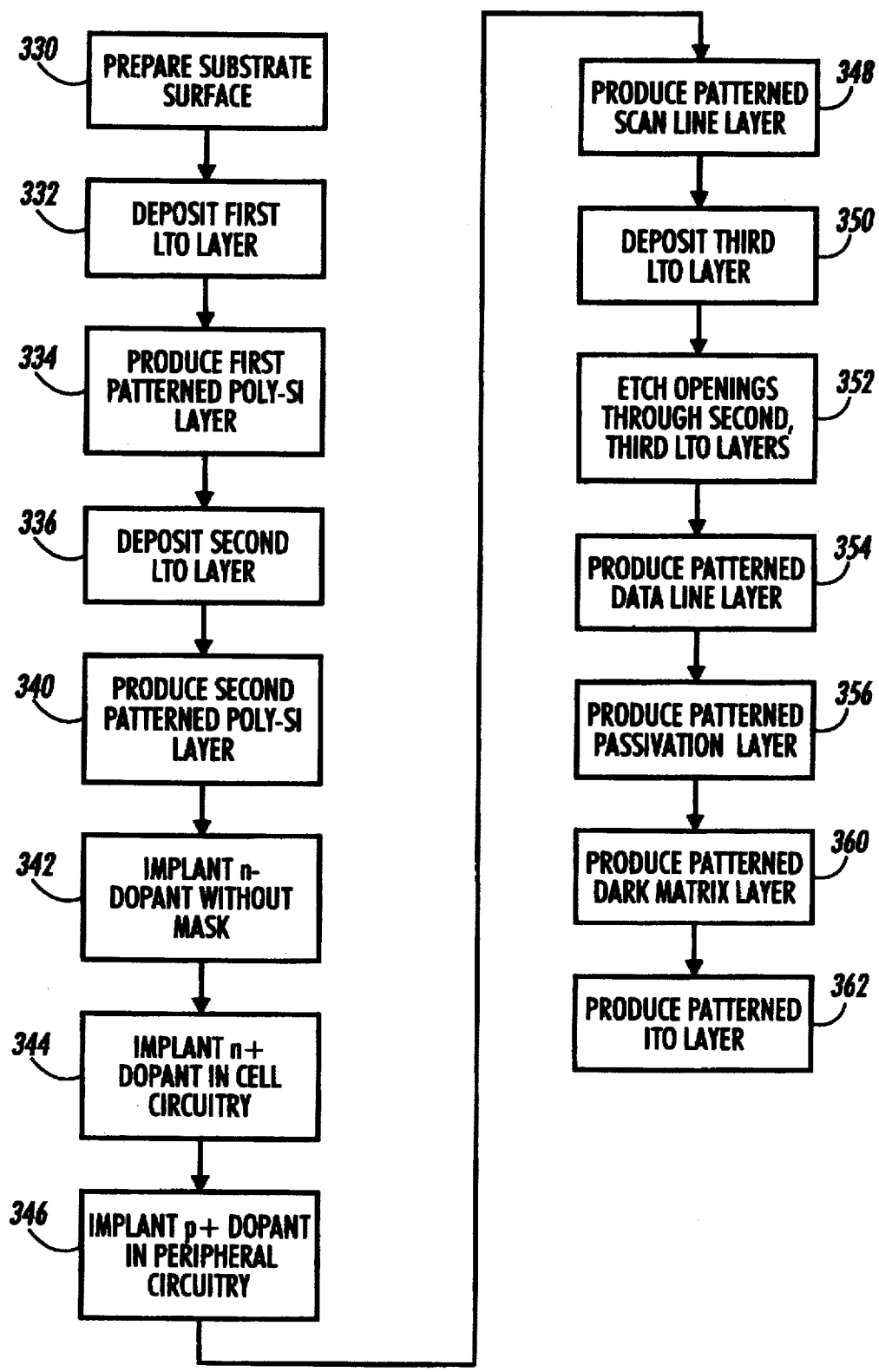
FIG. 9 is a flow chart of acts in producing the array of FIG. 5.

FIG. 9 shows acts in producing cell circuitry as described above. Additional details about fabrication of the cell circuitry can be understood from FIG. 14 of the Crossing Lines Application and the accompanying description, incorporated herein by reference.

The act in box 330 begins by preparing a surface of a quartz or glass substrate. The act in box 330 can include any necessary cleaning.

The act in box 332 then deposits a first layer of low temperature oxide (LTO), which can be $SiO_2$ deposited with plasma chemical vapor deposition. The first LTO layer can be deposited to a thickness of 0.7 μm and then annealed.

The act in box 334 deposits a layer of a-Si to a thickness of 0.1 μm, then performs Si self-ion implantation to enhance performance. The act in box 334 also performs crystallization and annealing at 600° C. As a result, the a-Si becomes poly-Si. The act in box 334 performs lithography to produce a pattern of mask material that covers the parts of the poly-Si that form first poly-Si pattern 210. Then, the act in box 334 etches to remove areas not covered by the pattern of mask material, leaving first poly-Si pattern 210.

The act in box 336 deposits a second layer of LTO to a thickness of 0.085 μm. The act in box 336 also performs oxidation at 950° C. under 150 atmospheres and anneals the second LTO layer.

The act in box 340 deposits a layer of poly-Si to a thickness of 0.35 μm. The act in box 340 performs lithography to produce a pattern of mask material that covers the parts of the poly-Si that form second poly-Si pattern 220 or another similar pattern that crosses first poly-Si pattern 210 at two or more channels. Then, the act in box 340 etches to remove areas not covered by the pattern of mask material, leaving second poly-Si pattern 220. Then, the act in box 340 removes the mask material.

The act in box 342 then implants a light concentration of an n-type dopant without a mask. As a result, all exposed portions of first poly-Si pattern 210 that are not covered by second poly-Si pattern 220 become lightly n-doped, with a dopant density that is approximately equal at all locations. In contrast with an LDD technique, the act in box 342 does not require a mask because second poly-Si line 220 covers channels 222 and 224, so that lightly n-doped intrachannel region 274 is self-aligned with channels 222 and 224. Therefore, intrachannel region 274 has a continuous distribution of dopant particles, with no internal boundaries between regions of different dopant density. Because local density of dopant particles is approximately equal to its average dopant density for all reasonably sized volumes within it, intrachannel region 274 is also uniformly doped, even though dopant density may vary slightly within the region.

The implanted concentration of dopant is chosen so that the resulting distribution of dopant particles in intrachannel region 274 will control reverse gate bias leakage current without significantly reducing ON current, as discussed above. For example, experiments with multichannel poly-Si structures show that, if channel leads have average dopant densities of 2E20 cm$^{-3}$, the average dopant density produced in box 342 can range from 5E15 cm$^{-3}$ up to 2E19 cm$^{-3}$, with average densities above 1E17 cm$^{-3}$ being most effective in maintaining ON current and with average densities below 2E18 cm$^3$ being effective in controlling reverse gate bias leakage current. At an average density of 1E18 cm$^{-3}$, for example, $I_{ON}$ is approximately $0.7I_{MAX}$, while at an average density of 1E17 cm$^{-3}$, $I_{ON}$ is approximately $0.5I_{MAX}$. The specific distribution of dopant particles should be chosen based on experimental results for the particular device, because various other parameters can determine what distribution of dopant particles will be effective, including channel lead dopant density; channel length and width; number of gates; intragate separations; and so forth. The distribution of dopant particles can be very uniform throughout each intrachannel region, so that the local dopant density at any position within each intrachannel region is approximately equal to the average dopant density.

The act in box 344 performs lithography to produce a pattern of mask material that does not cover the cell circuitry, but includes an island covering lightly doped region 230 in FIG. 6 so that intrachannel region 274 is covered. The island slightly overlaps second poly-Si pattern 220 so that lightly doped region 230 includes a part of second poly-Si pattern 220, which avoids the difficulty of aligning the edge of the island with the edge of second poly-Si pattern 220. The pattern of mask material may also cover areas in which peripheral circuitry is being formed on the substrate. The act in box 344 then implants a heavy concentration of an n-type dopant, making second poly-Si pattern 220 conductive and forming channel leads 272 and 276 in first poly-Si pattern 210. Then, the act in box 344 removes the mask material by an appropriate plasma resist etching.

The act in box 346 similarly performs lithography to produce a pattern of mask material that does not cover the peripheral circuitry, but covers the cell circuitry. The act in box 346 then implants a heavy concentration of a p-type dopant to form conductive areas in the peripheral circuitry. Then, the act in box 346 removes the mask material. The act in box 346 can also perform crystallization annealing at 600° C.

The act in box 348 deposits a layer of metal to a thickness of 0.1–0.2 μm to produce a scan line layer. The scan line layer can, for example, be a hybrid TiW/AlCu multilayer stack with three or four layers of 0.01 μm of TiW separated by two or three layers of 0.05 of AlCu.

The act in box 348 then performs lithography to produce a pattern of mask material that covers the parts of the scan line layer that form the scan lines. Then, the act in box 348 etches to remove areas not covered by the pattern of mask material, leaving the scan lines. Then, the act in box 348 removes the mask material.

The act in box 350 deposits a third layer of LTO to a thickness of 0.7 μm. The act in box 350 also performs hydrogenation to passivate the channels in first poly-Si pattern 210 and an appropriate wet oxide etch to remove the damaged layer resulting from the hydrogenation process. This hydrogenation does not cause degradation of channels in first poly-Si pattern 210 because the scan lines formed in box 346 are not over the channels in first poly-Si pattern 210.

The act in box 352 performs lithography to produce a pattern of mask material that does not cover first and second connection points 212 and 214 and any other areas in which metal in the data line layer contacts the layer formed in box 334, but covers all other areas. The act in box 352 then etches to form openings in the second and third LTO layers from boxes 336 and 350 in the areas that are not covered. Then, the act in box 352 removes the mask material.

The act in box 354 deposits a data metal layer to a thickness of 0.5 μm. The data metal layer can, for example, be a hybrid TiW/AlCu multilayer stack as described above. The act in box 354 then performs lithography to produce a pattern of mask material that covers the parts of the data line layer that form the data lines and that cover the opening to second connection point 214. Then, the act in box 354 etches to remove areas not covered by the pattern of mask material, leaving the data lines. Then, the act in box 354 removes the mask material.

The act in box 356 deposits a passivation layer of polyimide to a thickness of 1.5 μm. The act in box 356 performs lithography to produce a pattern of mask material that does not cover second connection point 214 and any other areas in which metal in the data line layer should be exposed for contact. The act in box 356 then etches to form openings in the passivation layer in the areas that are not covered. Then, the act in box 356 removes the mask material.

The act in box 360 deposits a dark matrix layer of TiW to a thickness of 0.1 μm. The act in box 360 performs lithography to produce a pattern of mask material that covers the dark matrix layer only in areas in which light shielding is needed, such as along the edges of each data line and around second connection point 214. The act in box 360 then etches to remove the areas that are not covered. Then, the act in box 360 removes the mask material.

The act in box 362 deposits ITO to a thickness of 0.055 μm The act in box 362 performs lithography to produce a pattern of mask material that covers the ITO layer in light transmissive cell areas. The act in box 362 then etches to remove the areas that are not covered. Then, the act in box 362 removes the mask material and anneals the ITO layer at 280° C.

C.4. Operation

An array as described above can be operated by providing signals as described in Wu, I-Wei, "High-definition displays and technology trends in TFT-LCDs," *Journal of the SID*, Feb. 1, 1994, pp. 1–14, incorporated herein by reference. In FIG. 6, described on page 8, Wu illustrates several driving methods for liquid crystal displays (LCDs).

For dot or pixel inversion driving techniques, WDC occurs when $V_{GS}=-7V$ and $V_{DS}=+5V$. For other driving techniques, such as frame inversion, gate line inversion, and column inversion, WDC occurs when $V_{GS}=-2V$ and $V_{DS}=+10V$.

It is expected, for example, that a solid-phase crystallized poly-Si TFT with two gates, a total channel length of 40 μm, and a uniformly doped intrachannel region with an average dopant density of 1E18 cm$^{-3}$ will have a controlled reverse gate bias leakage current of approximately 2 –5E–14 amp/μm at WDC with dot or pixel inversion driving techniques. In contrast, with the other driving techniques described above, the WDC reverse gate bias leakage current of the same TFT but with a heavily doped intrachannel region would reach a minimum of approximately 2–5E–13 amp/μm at $V_{GS}$=–1 and would rise to approximately 1E–10 amp/μm at $V_{GS}$=–10. Further, with the dot or pixel inversion driving technique described above, the WDC reverse gate bias leakage current of the same TFT but with a heavily doped intrachannel region would reach a minimum of approximately 0.8–2E–13 amp/μm at $V_{GS}$=–4 and would rise to approximately 1E –12 amp/μm at $V_{GS}$=–10.

C.5. Simulation and Experimental Results

Figure 10:
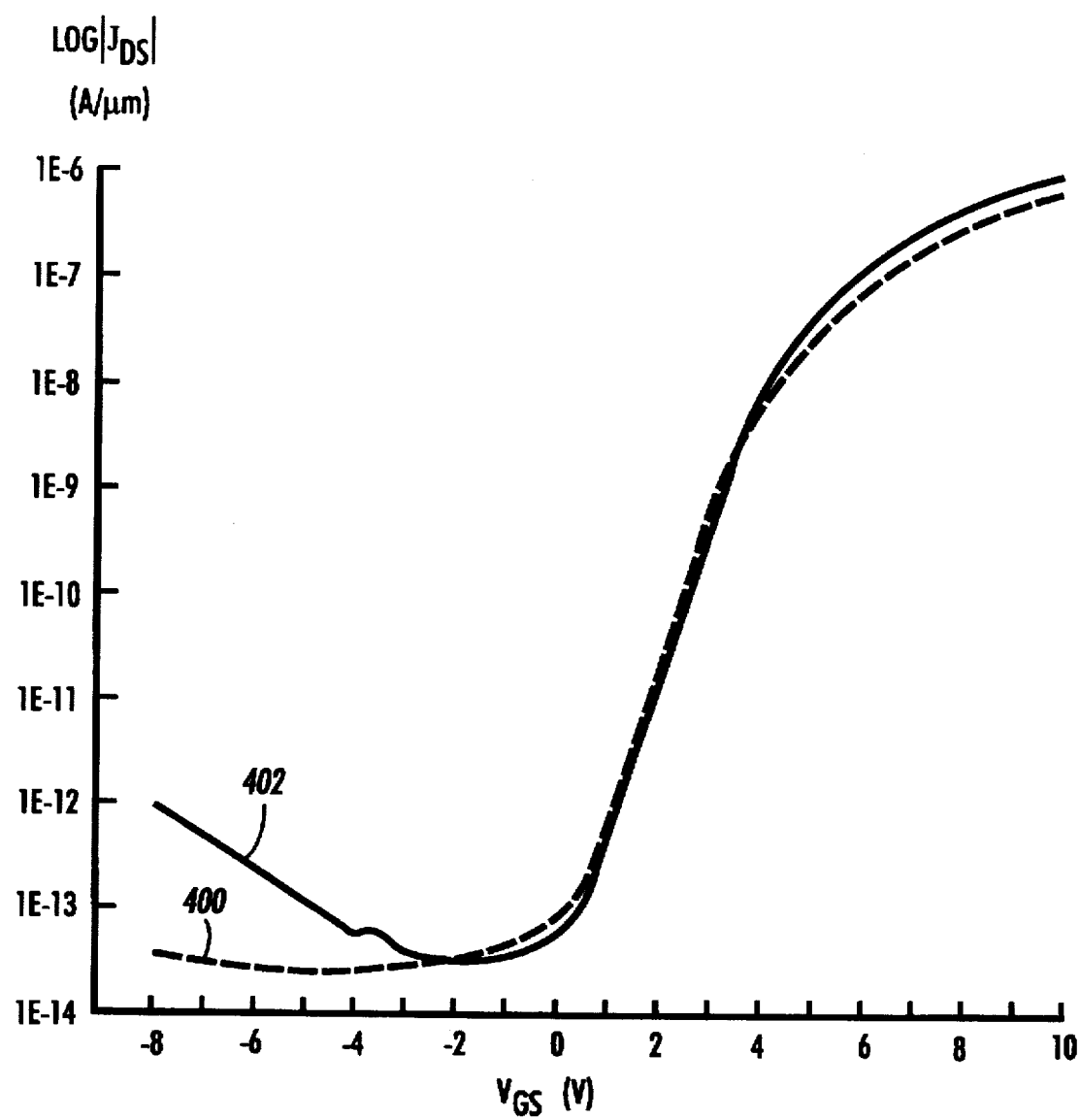
FIG. 10 is a graph showing the results of a simulation of drain-to-source current as a function of gate-to-source voltage for two distributions of dopant particles in an intrachannel region.
Figure 11:
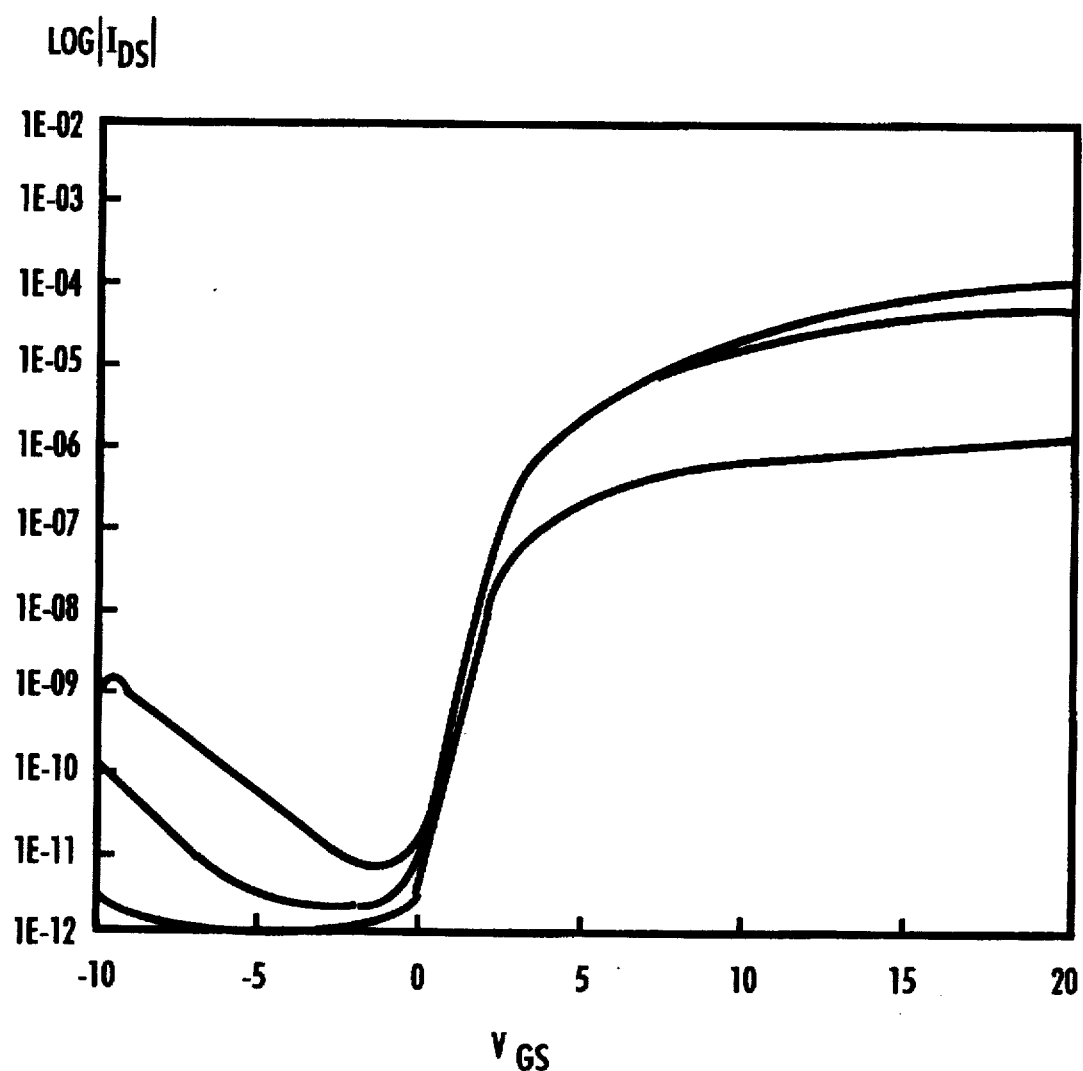
FIG. 11 is a graph showing measured values of drain-to-source current as a function of gate-to-source voltage for a conventionally doped intrachannel region.
Figure 12:
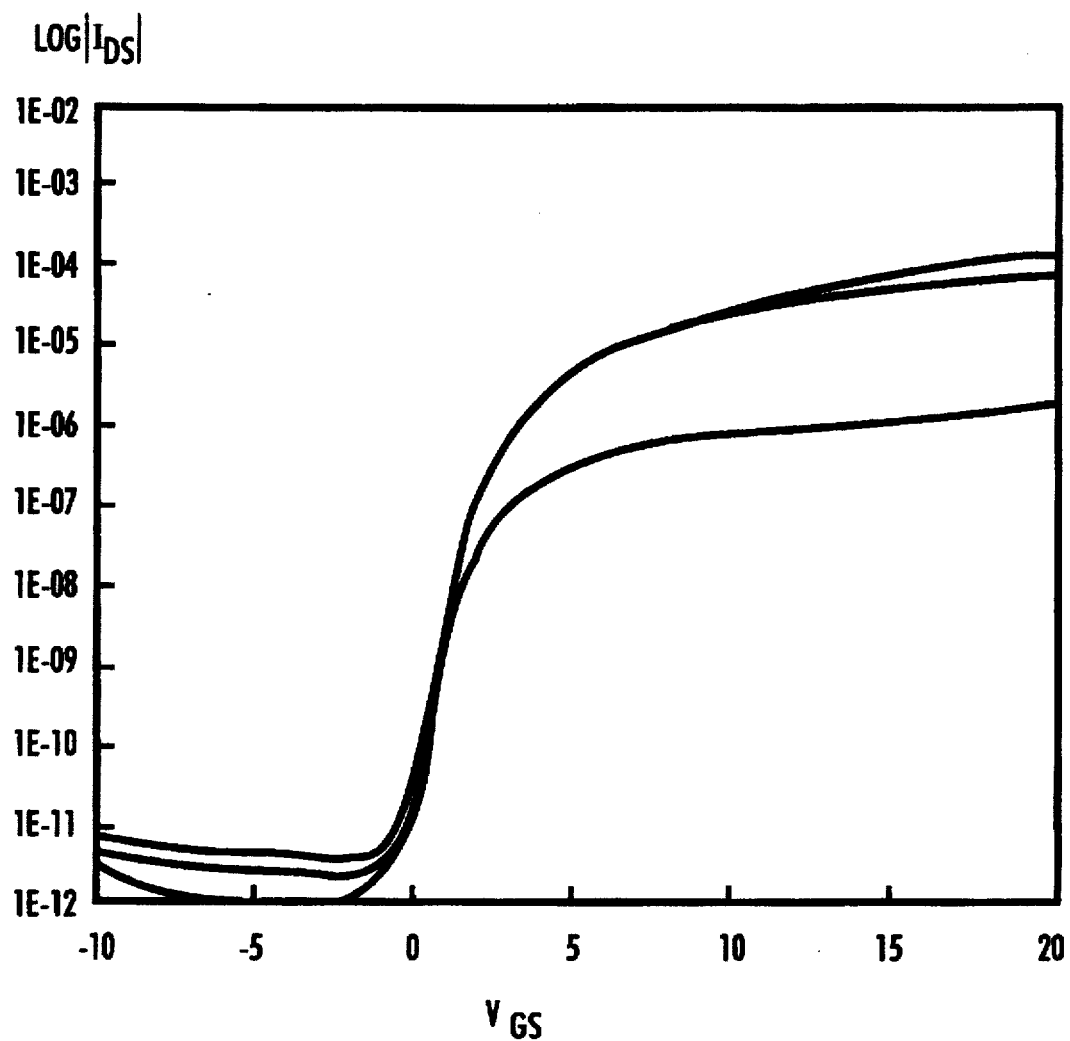
FIG. 12 is a graph showing measured values of drain-to-source current as a function of gate-to-source voltage for an intrachannel region with a distribution of dopant particles that controls reverse gate bias leakage current.

FIG. 10 shows the results of a numerical simulation comparing multichannel poly-Si structures in which intrachannel regions are uniformly doped, either to the same average dopant density as channel leads or to a lower average dopant density. FIGS. 11 and 12 show results obtained from a test chip making similar comparisons.

The graph in FIG. 10 shows drain-to-source current density $J_{DS}$ as a function of gate-to-source voltage $V_{GS}$ for two numerically simulated device. Curve 400 shows simulation results for a multichannel poly-Si TFT with an average dopant density of 5E17 cm$^{-3}$ in each intrachannel region. Curve 402 shows simulation results for a multichannel poly-Si TFT with an average dopant density of 2E19 cm$^{-3}$ in each intrachannel region. In both cases, the TFT's channel leads were assumed to have an average dopant density of 2E19 cm$^{-3}$.

Curve 402 shows how, with heavily doped intrachannel regions, the reverse gate bias leakage current density rises exponentially from its minimum; in contrast, curve 400 shows that the distribution of dopant particles in lightly doped intrachannel regions controls leakage current density across a range of reverse gate bias voltages. As a result, for large reverse gate bias voltages, leakage current is more than a magnitude higher with heavy doping of intrachannel regions than with light doping. Curves 400 and 402 also show that light doping of intrachannel regions does not significantly reducing ON current from that obtained with heavy doping.

The techniques described above have been implemented in a test chip on which were formed multichannel poly-Si structures with a variety of different values for several parameters. The number of channels per structure varied from one to eight. The doping configurations included heavily doped channel leads without any LDD regions and heavily doped intrachannel regions; heavily doped channel leads with LDD regions and heavily doped intrachannel regions; and heavily doped channel leads and lightly doped intrachannel regions, in accordance with the technique described above. Channel leads were doped at densities of 2E20 cm$^{-3}$, and the lightly doped intrachannel regions were doped at densities ranging from 1E17 cm$^{-3}$ to 1E19 cm$^{-3}$. The channel widths varied from 1 to 50 μm. The channel lengths varied from 1 to 50 μm. Different processes were used, including high temperature process with silicon implant, high temperature without silicon implant, medium temperature without silicon implant, and laster crystallized low temperature without silicon implant.

The poly-Si structures on the test chip were operated by fixing source voltage and varying gate and drain voltage to simulate various operating conditions. The results showed that, with appropriate distributions of dopant particles in intrachannel regions, ON current could be maintained above half its maximum level while reverse gate bias leakage current could be controlled across a range of reverse gate biases including WDC, with leakage current at WDC reduced by as much as an order of magnitude or more.

FIGS. 11 and 12 show examples of test results for two-channel structures with widths and lengths of 50 μm, with channel layer and oxide layer thicknesses of 1000 Å, and with continuous distributions of dopant particles in intrachannel regions. In FIG. 12, intrachannel regions had average dopant densities of 1E18 cm$^{-3}$, while intrachannel regions were doped to the same level as channel leads in FIG. 11. In each figure, the upper curve shows results at $V_{DS}$=10 V; the middle curve at $V_{DS}$=5 V; and the lower curve at $V_{DS}$=0.1 V.

As can be seen, the distribution of dopant particles in intrachannel regions in FIG. 12 controlled reverse gate bias leakage current without significantly reducing ON current. In FIG. 11, on the other hand, leakage current increased exponentially with increasing reverse gate bias voltage for medium and high drain-to-source biases, and was controlled only for low drain-to-source bias, at which there should be no high field effects between the channel leads and therefore no drain-to-source leakage current.

These results confirm that continuous distributions of dopant particles in intrachannel regions can control reverse gate bias leakage current without significantly reducing ON current.

C.6. Variations

The implementation described above provides thin film circuitry on an insulating substrate, such as quartz or glass. The invention could be implemented with other types of circuitry on other types of substrates.

The implementation described above provides circuitry with specific geometric and electric characteristics, but the invention could be implemented with different geometries and with different circuitry.

The implementation described above includes layers of specified thicknesses, produced from specified materials by specified processes, but other thicknesses could be produced, and other materials and processes could be used. For example, rather than poly-Si TFTs, the invention could be implemented with a wide range of other insulated gate field effect transistors, including, but not limited to, SOI (silicon on insulator), SOQ (silicon on quartz) and SOS (silicon on sapphire), and bulk single crystal MOSFETs. Also, various conductive materials other than a hybrid TiW/AlCu multilayer stack could be used in the scan lines and data lines, including but not limited to ITO, Al, MoTa, Cr, MoCr, Ta, Cu, Ti, TiN, and organic conductive materials. Similarly, insulating layers other than LTO layers of SiO$_2$ could be used, such as polyimide, nitride, or other forms of SiO$_2$.

The implementation described above includes layers in a specific sequence, but the sequence of layers could be modified, such as by producing bottom gate TFT structures. For example, each gate region could cross under a channel rather than over it.

The implementation described above has a layout and a transmissive ITO layer appropriate for a light valve used in a display, but a layout and layers appropriate for another application could be used, such as a light valve used for another application, a sensor array, or a memory array. If an LCD light valve with twisted nematic liquid crystal material, an array appropriate for operation at $V_{DD} \leq 12V$ is required, but if with PDLC or cholesteric liquid crystal material, an array appropriate for operation at $V_{DD}$=20 or 30V may be required.

The above implementation employs enhancement mode n-channels that are highly conductive when gate voltage is high, but it may be possible to implement the invention with depletion mode channels and with p-channels.

The implementation described above uses dopant densities in specified ranges, but densities in other ranges could be used if they affect reverse gate bias leakage current and ON current in the same way.

The implementation described above forms an array with a metal scan line controlling a semiconductor gate line in accordance with the inventions described in copending, coassigned U.S. patent applications Ser. No. 08/368,123, now continued as U.S. patent application Ser. No. 08/572,357 entitled "Array with Metal Scan Lines Controlling Semiconductor Gate Lines," and U.S. patent application Ser. No. 08/367,983, now issued as U.S. Pat. No. 5,557,534 entitled "Forming Array with Metal Scan Lines to Control Semiconductor Gate Lines," both incorporated herein by reference. The invention could, however, be implemented with other techniques. For example, both the scan lines and the gate regions could be formed of the same metal or semiconductor material, which could be patterned in a single lithographic operation.

In the implementation described above, a poly-Si TFT has channels and channel leads formed in the same layer, but the channel leads could be in a different layer than the channels.

The invention has been disclosed in relation to arrays fabricated according to the techniques disclosed in copending, coassigned U.S. patent applications Ser. No. 08/560,724, entitled "Forming Array Having Multiple Channel Structures with Continuously Doped Interchannel Regions,"incorporated herein by reference. The invention could, however, be implemented in arrays fabricated with other techniques.

D. Applications

The invention could be applied in many ways, including light valve arrays or other arrays for displays, printers, or other output applications; sensor arrays; and memory arrays.

Application of the invention in a light valve array for a display can be understood from FIG. 15 and the description in the Crossing Lines Application, incorporated herein by reference, which describes an active matrix liquid crystal display (AMLCD). Each cell's component includes a capacitive element that stores charge at a level that controls presentation of a part of an image, such as a pixel.

Application in a sensor array would be similar to a light valve array, but each cell's component would include appropriate layers for sensing electromagnetic radiation and a capacitive element that would store charge at a level indicating intensity of radiation from part of a received image.

Application in a memory array would also be similar to a light valve array, with the poly-Si TFT being the load transistor of the memory array. Each cell could include a capacitive element that would store charge at a level indicating information.

E. Miscellaneous

The invention has been described in relation to thin-film implementations, but the invention might be implemented with single crystal technology.

Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed:

1. A display comprising:
   a two-dimensional M×N array comprising:
   M scan lines;
   N data lines; and
   for each of a set of pairs of values (m, n), cell circuitry connected to the mth scan line and the nth data line; the cell circuitry comprising:
   a capacitive element having a data lead for receiving signals from the nth data line; during operation of the array circuitry, the capacitive element storing a level of charge within one of two or more distinct voltage bands for a storage period; the voltage level indicating one of a set of two or more values; and
   a polysilicon thin film transistor (poly-Si TFT) for electrically connecting the data lead to the nth data line under control of the mth scan line: the poly-Si TFT comprising:
   first and second channels electrically connected in series between the nth data line and the data lead; the first and second channels each being conductive; the first and second channels having dopant particles at a first average dopant density;
   first and second gates electrically connected to the mth scan line; the first gate extending across the first channel; the second gate extending across the second channel; and
   between the first and second channels, an intrachannel region that has a continuous distribution of dopant particles; the continuous distribution being a second average dopant density, the second average dopant density being less than the first average dopant density.

2. An article of manufacture comprising:
   a substrate with a surface at which circuitry can be formed; and
   array circuitry formed at the surface of the substrate, the array circuitry comprising:
   a set of M scan lines, where M is greater than 1;
   a set of N data lines, where N is greater than 1; and
   for each of a set of pairs of values (m, n), cell circuitry connected to the mth scan line and the nth data line; the cell circuitry comprising:
   a component having a data lead for receiving signals from or providing signals to the nth data line; and
   connecting circuitry for electrically connecting the data lead to the nth data line under control of the mth scan line; the connecting circuitry comprising:
   a thin film transistor electrically connected between the nth data line and the data lead; the thin film transistor including:
   a series of Q channels in a semiconductor layer, where Q is two or more;
   first and second channel lead regions; the first channel lead region being electrically connected between the nth data line and a first one of the Q channels; the second channel lead region being electrically connected between a Qth one of the Q channels and the data lead; the first and second channel lead regions each being conductive; the first and second channel lead regions both including dopant particles at a first average dopant density; and
   (Q-1) intrachannel regions in the semiconductor layer, with one of the (Q-1) intrachannel regions being between each pair of adjacent channels in the series; each of the intrachannel regions being uniformly doped and including dopant particles at approximately a second average dopant density; the second average dopant density being less than the first average dopant density; and
   Q gate regions, each gate region being a part of a layer other than the semiconductor layer; for each value of q from 1 through Q, the qth gate region extending across the part of the semiconductor layer at the qth channel; each of the Q gate regions being electrically connected to the mth scan line so that, when the mth scan line is at a first voltage, the Q channels are all highly conductive and so that, when the mth scan line is at a second voltage, the Q channels only pass leakage current;

the dopant particles in the uniformly doped intrachannel regions together having a distribution that controls reverse gate bias leakage current through the Q channels and that does not significantly reduce ON current through the Q channels.

3. The article of claim 2 in which the first and second channel leads are formed in the semiconductor layer.

4. The article of claim 3 in which the array circuitry is driven with a driving technique; the second average dopant density being above a low dopant density at which ON current equals half the ON current that would occur if the second average dopant density were equal to the first average dopant density; the second average dopant density further being below a high dopant density at which reverse bias leakage current equals a maximum permissible leakage current that can occur under a worst-case driving condition for the driving technique.

5. The article of claim 2 in which Q=2; the Q channels including a first channel and a second channel, separated by an intrachannel region; the first channel lead being connected to receive a source voltage and the second channel lead being connected to receive a drain voltage; the array circuitry including a first junction between the intrachannel region and the first channel lead and a second junction between the second channel lead and the second channel; a first depletion region occurring at the first junction and a second depletion region occurring at the second junction; voltage drop between the drain voltage and the source voltage being divided between the first depletion region and the second depletion region; voltage drop across the first depletion region spreading across a longer distance than across the second depletion region.

6. The article of claim 2 in which the semiconductor layer is a polysilicon layer.

7. The article of claim 2 in which the first voltage is a high voltage and the second voltage is a low voltage.

8. The article of claim 2 in which each of the Q gate regions is part of a gate layer.

9. The article of claim 2 in which the second average dopant density is sufficiently great that a current that flows between the first and second channel leads when the mth scan line is at the first voltage is at least half as great as a current that would flow when the mth scan line is at the first voltage if the second average dopant density were equal to the first average dopant density.

10. The article of claim 9 in which the first and second channel lead regions include the dopant particles at an average dopant density of approximately 2E20 particles per cubic centimeter.

11. The article of claim 2 in which the dopant particles in the first and second channel lead regions and in the intrachannel regions are particles of an n-type dopant.

12. The article of claim 2 in which each of the intrachannel regions is uniformly doped.

13. The article of claim 2 in which each of the intrachannel regions includes the dopant particles at an average dopant density between 2E15 and 2E19 particles per cubic centimeter.

14. The article of claim 2 in which each of the intrachannel regions includes the dopant particles at an average dopant density between 2E17 and 2E18 particles per cubic centimeter.

15. The article of claim 2 in which each of the intrachannel regions includes the dopant particles at an average dopant density of approximately 1E18 particles per cubic centimeter.

16. The article of claim 2 in which each of the intrachannel regions includes the dopant particles at an average dopant density of approximately 1E17 particles per cubic centimeter.

17. The article of claim 2 in which Q is two.

18. The article of claim 2 in which the scan lines are parallel to each other; the data lines are parallel to each other; and the scan lines are perpendicular to the data lines.

19. The article of claim 2 in which the array is a two-dimensional array.

20. The article of claim 2 in which the substrate is an insulating substrate.

21. The article of claim 2 in which the distribution of dopant particles in the (Q-1) intrachannel regions ensures that reverse gate bias leakage current through the Q channels is approximately constant across a range of reverse gate bias voltages that occurs during operation of the array circuitry.

22. The article of claim 2 in which the cell circuitry's component includes a capacitive element that, during operation of the array circuitry, stores a level of charge within one of two or more distinct voltage bands for a storage period; the distribution of dopant particles in the (Q-1) intrachannel regions ensuring that reverse gate bias leakage current through the Q channels is sufficiently low that the level of charge stored by the capacitive element remains within its voltage band during the storage period.

23. The article of claim 2 in which the article is a light valve; the cell circuitry's component including a capacitive element that stores a level of charge during operation of the array circuitry; the level of charge stored by the capacitive element controlling part of an image.

24. The article of claim 2 in which the article is a sensor array; the cell circuitry's component including a capacitive element that stores a level of charge during operation of the array circuitry; the level of charge stored by the capacitive element indicating intensity of part of an image.

25. The article of claim 2 in which the article is a memory; the cell circuitry's component including a capacitive element that stores a level of charge during operation of the array circuitry; the level of charge stored by the capacitive element indicating information.

26. An article of manufacture comprising:

a substrate with a surface at which circuitry can be formed; and two-dimensional array circuitry formed at the surface of the substrate, the array circuitry comprising:

a set of M scan lines, where M is greater than 1;

a set of N data lines, where N is greater than 1; and for each of a set of pairs of values (m, n), cell circuitry connected to the mth scan line and the nth data line; the cell circuitry comprising:

a capacitive element having a data lead for receiving signals from or providing signals to the nth data line; during operation of the array circuitry, the capacitive element storing a level of charge within one of two or more distinct voltage bands for a storage period; and a polysilicon thin film transistor (poly-Si TFT) for electrically connecting the data lead to the nth data line under control of the mth scan line; the poly-Si TFT comprising:

a first channel lead electrically connected to the nth data line and a second channel lead electrically connected to the data lead; the first and second channel leads including a first average dopant density;

first and second channels in series between the first and second channel leads; the first channel being electrically connected to the first channel lead and the second channel being electrically connected to the second channel lead;

first and second gates electrically connected to the mth scan line; the first gate extending across the first channel; the second gate extending across the second channel; and between the first and second channels, an intrachannel region that has a continuous distribution of dopant particles; the intrachannel region including a second average dopant density; the second average dopant density being lower than the first average dopant density; the second average dopant density being sufficiently high that ON current through the poly-Si TFT is at least as great as half of an ON current that would flow if the second average dopant density were equal to the first average dopant density; the second average dopant density being sufficiently low to control reverse gate bias leakage current through the poly-Si TFT;

the intrachannel region of each poly-Si TFT having a distribution of dopant particles that ensures that the reverse gate bias leakage currents through the poly-Si TFTs are approximately constant across a range of reverse gate bias voltages that occurs during operation of the array circuitry;

the distribution of dopant particles of the intrachannel region of each poly-Si TFT further ensuring that reverse gate bias leakage current through the TFT is sufficiently low that the level of charge stored by the capacitive element remains within its voltage band during the storage period.

27. An article of manufacture comprising:

a substrate with a surface at which circuitry can be formed; and array circuitry formed at the surface of the substrate, the array circuitry comprising:

a set of M scan lines, where M is greater than 1;

a set of N data lines, where N is greater than 1; and for each of a set of pairs of values (m, n), cell circuitry connected to the mth scan line and the nth data line; the cell circuitry comprising:

a component having a data lead for receiving signals from or providing signals to the nth data line; and connecting circuitry for electrically connecting the data lead to the nth data line under control of the mth scan line; the connecting circuitry comprising:

a part of a semiconductor layer electrically connected between the nth data line and the data lead; the part of the semiconductor layer including:

a series of Q channels, where Q is two or more;

(Q-1) intrachannel regions, with one of the (Q-1) intrachannel regions being between each pair of adjacent channels in the series;

first and second channel lead regions; the first channel lead region being electrically connected between the nth data line and a first one of the Q channels; the second channel lead region being electrically connected between a Qth one of the Q channels and the data lead; the first and second channel lead regions each being conductive;

the first and second channel lead regions both including dopant particles at a first average dopant density; each of the intrachannel regions including dopant particles at a second average dopant density; the second average dopant density being less than the first average dopant density: and Q gate regions, each gate region being a part of a layer other than the semiconductor layer; for each value of q from 1 through Q, the qth gate region extending across the part of the semiconductor layer at the qth channel; each of the Q gate regions being electrically connected to the mth scan line so that, when the mth scan line is at a first voltage, the Q channels are all highly conductive and so that, when the mth scan line is at a second voltage, the Q channels only pass leakage current;

the part of the semiconductor layer including, in each of the (Q-1) intrachannel regions, a continuous distribution of dopant particles; the distributions of dopant particles in the intrachannel regions together being a distribution that controls reverse gate bias leakage current through the Q channels and that does not significantly reduce ON current through the Q channels.

* * * * *